(12) United States Patent
Tanaka

(10) Patent No.: US 8,173,977 B2
(45) Date of Patent: May 8, 2012

(54) LASER IRRADIATION APPARATUS AND LASER IRRADIATION METHOD

(75) Inventor: Koichiro Tanaka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 700 days.

(21) Appl. No.: 11/861,456

(22) Filed: Sep. 26, 2007

(65) Prior Publication Data

US 2008/0081298 A1    Apr. 3, 2008

(30) Foreign Application Priority Data

Oct. 3, 2006   (JP) ................................ 2006-271363

(51) Int. Cl.
*G21G 5/00* (2006.01)

(52) U.S. Cl. ............. 250/492.2; 250/492.1; 250/492.22; 250/492.23

(58) Field of Classification Search ............... 250/492.1, 250/492.2, 492.22, 492.23; 438/166, 795, 438/799
See application file for complete search history.

(56) References Cited

U.S. PATENT DOCUMENTS

| | | | |
|---|---|---|---|
| 6,528,397 B1 * | 3/2003 | Taketomi et al. | 438/487 |
| 6,961,361 B1 * | 11/2005 | Tanaka | 372/101 |
| 6,984,573 B2 | 1/2006 | Yamazaki et al. | |
| 7,078,281 B2 * | 7/2006 | Tanaka et al. | 438/166 |
| 7,105,048 B2 | 9/2006 | Yamazaki et al. | |
| 7,135,389 B2 | 11/2006 | Yamazaki et al. | |
| 7,214,573 B2 | 5/2007 | Yamazaki et al. | |
| 7,521,326 B2 | 4/2009 | Tanaka | |
| 2002/0151121 A1 * | 10/2002 | Tanaka | 438/166 |
| 2003/0042430 A1 * | 3/2003 | Tanaka et al. | 250/492.1 |
| 2003/0132209 A1 * | 7/2003 | Kawaguchi et al. | 219/121.73 |
| 2004/0266223 A1 * | 12/2004 | Tanaka et al. | 438/795 |
| 2005/0115930 A1 | 6/2005 | Tanaka et al. | |
| 2005/0215077 A1 * | 9/2005 | Takeda et al. | 438/795 |
| 2005/0247684 A1 | 11/2005 | Tanaka | |
| 2006/0205101 A1 * | 9/2006 | Lee et al. | 438/22 |
| 2007/0000428 A1 | 1/2007 | Yamazaki et al. | |
| 2007/0063226 A1 | 3/2007 | Tanaka et al. | |
| 2007/0077696 A1 | 4/2007 | Tanaka et al. | |
| 2007/0138151 A1 | 6/2007 | Tanaka et al. | |
| 2007/0158315 A1 | 7/2007 | Tanaka et al. | |
| 2007/0190810 A1 | 8/2007 | Yamazaki et al. | |
| 2009/0127477 A1 | 5/2009 | Tanaka | |
| 2009/0173893 A1 * | 7/2009 | Tanaka et al. | 250/492.2 |
| 2009/0181483 A1 * | 7/2009 | Taniguchi et al. | 438/33 |
| 2010/0117093 A1 * | 5/2010 | Lee et al. | 257/72 |

FOREIGN PATENT DOCUMENTS

| | | |
|---|---|---|
| JP | 03-082014 | 4/1991 |
| JP | 2005-191546 | 7/2005 |

\* cited by examiner

*Primary Examiner* — Michael Maskell
(74) *Attorney, Agent, or Firm* — Nixon Peabody LLP; Jeffrey L. Costellia

(57) ABSTRACT

It is an object of the present invention to provide a laser irradiation apparatus and a laser irradiation method that increase energy intensity distribution in a region having low energy intensity distribution in an end region in a major-axis direction of laser light, in performing laser irradiation. In irradiating an irradiation surface with laser light, laser light oscillated from a laser oscillator is converged in one direction through an optical element. The laser light which passes through the optical element and which is converged in one direction passes through a means which shields an end region in a major-axis direction of the laser light. Accordingly, a region where energy intensity distribution is precipitously high in the end region in the major-axis direction of the laser light can be formed in the irradiation surface.

22 Claims, 15 Drawing Sheets

Axis indicating space dimension of major-axis direction of laser

Axis indicating space dimension of major-axis direction of laser

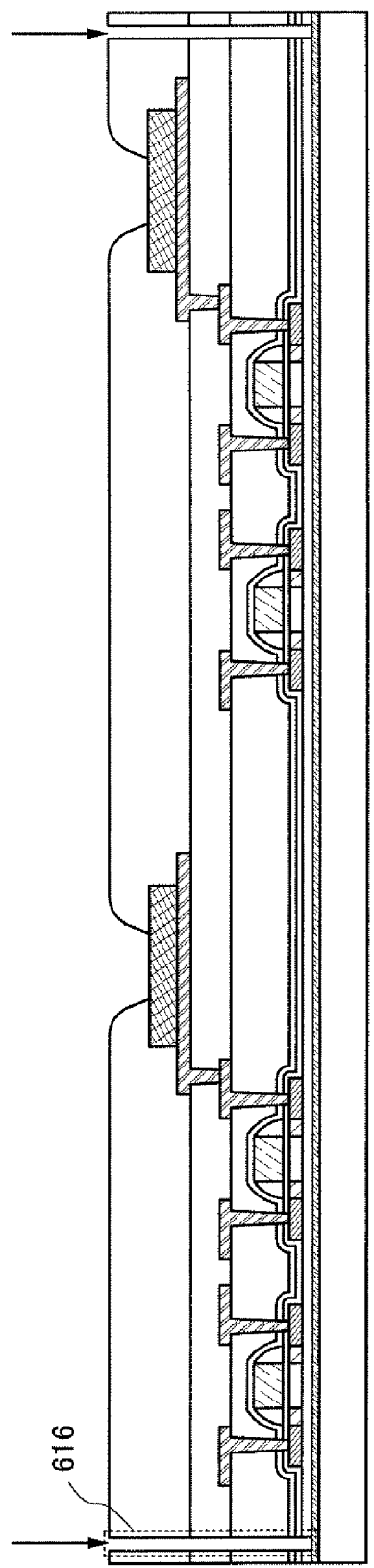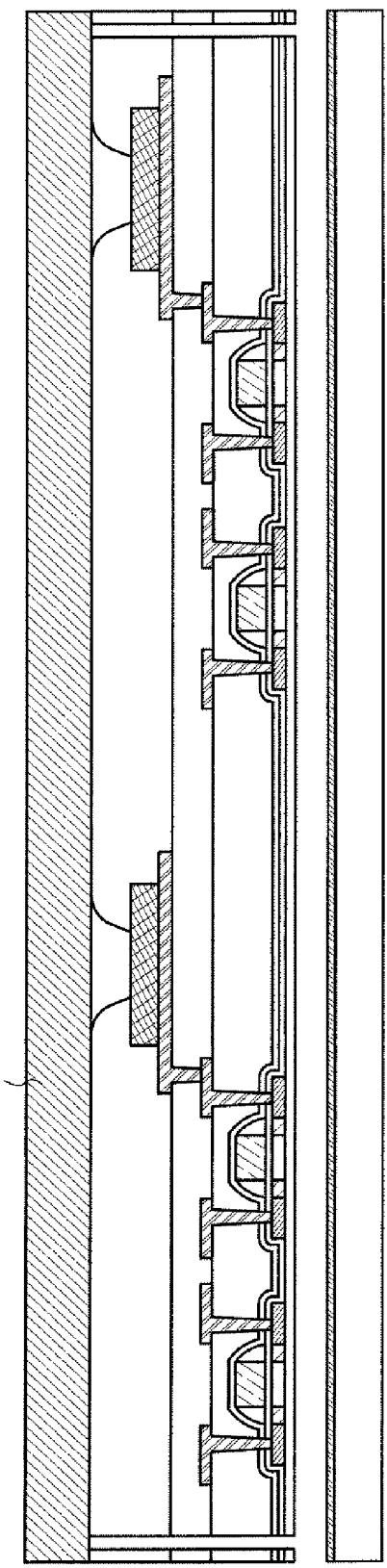

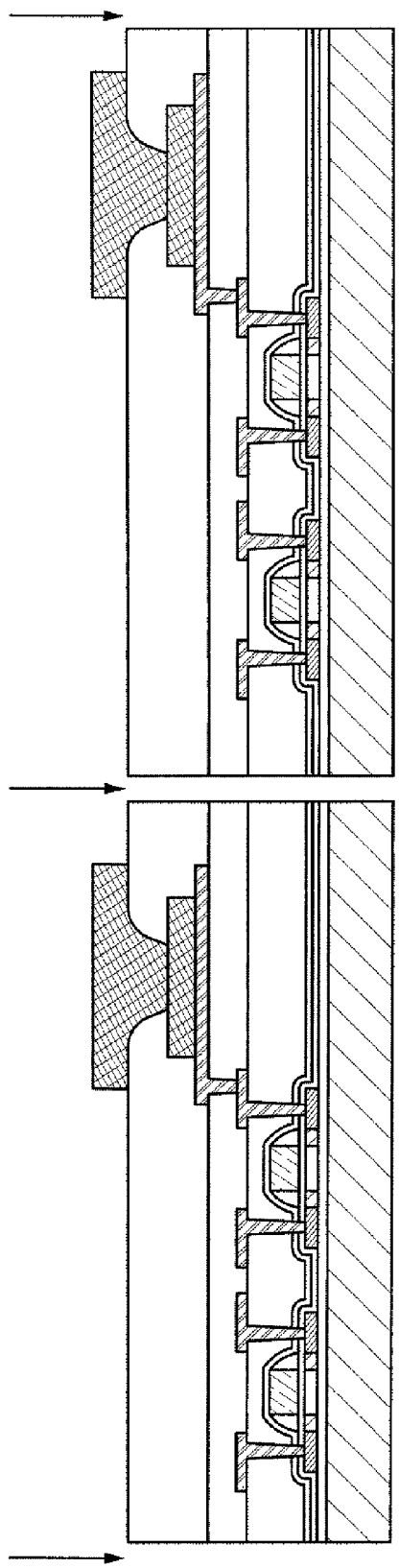
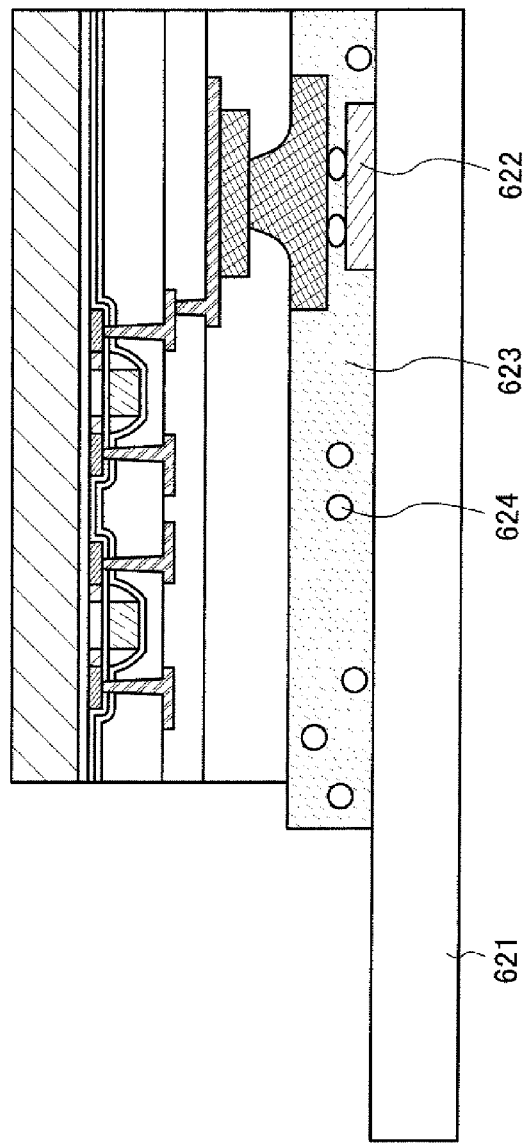
FIG. 10A
FIG. 10B

Axis indicating space dimension of major-axis direction of laser

LASER IRRADIATION APPARATUS AND LASER IRRADIATION METHOD

BACKGROUND OF THE INVENTION

1. Field of the Invention

The present invention relates to a laser irradiation apparatus and a laser irradiation method.

2. Description of the Related Art

In recent years, extensive research has been conducted on laser crystallization methods used to crystallize a semiconductor film (for example, an amorphous semiconductor film) formed over a glass substrate through irradiation of the semiconductor film with laser light.

Crystallization of a semiconductor film is performed in order to increase carrier mobility through crystallization of the semiconductor film. The crystallized semiconductor film is used, for example, in a thin film transistor (hereinafter described as a TFT). When a semiconductor film formed over a glass substrate has been crystallized, an active matrix display device (for example, a liquid crystal display device or an organic EL display device) can be manufactured through formation of a TFT for use in a pixel and TFT for use in a driver circuit, using the semiconductor film.

Methods for crystallizing a semiconductor film, other than the laser crystallization method, include a thermal annealing method which uses an annealing furnace and a rapid thermal annealing method (RTA method). However, these methods need treatment at a high temperature greater than or equal to 600° C. Because of this, use of a quartz substrate that can withstand treatment at high temperature is necessary and causes manufacturing costs to increase. In comparison with these methods, since heat can be absorbed only by a semiconductor film in the laser crystallization method, the semiconductor film can be crystallized without increasing the temperature of the substrate very much. Therefore, a material with low heat resistance, such as glass or plastic, can be used for the substrate. Accordingly, an inexpensive glass substrate that can be easily processed with a large area can be used, and the production efficiency of the active matrix display device increases considerably.

Conventionally, a method using an excimer laser which is a pulsed laser has been used as the laser crystallization method. Since a wavelength of an excimer laser belongs to an ultraviolet region, the laser can be efficiently absorbed by silicon and heat can be selectively applied to silicon. When an excimer laser is used, for example, laser light with a rectangular shape (for example, a rectangular shape with an area of 10 mm×30 mm) emitted from a laser oscillator is processed by an optical system into laser light with a linear cross section (for example, a linear cross section with an area of several hundreds of micrometers×300 mm). Then, a semiconductor film is irradiated with the linearly processed laser light while the laser light is moved relative to the semiconductor film, whereby the whole semiconductor film is crystallized sequentially. With the direction, in which the laser light is moved, being perpendicular relative to the laser light, crystallization efficiency increases.

In comparison, in recent years, a technology for manufacturing a semiconductor film including a region with crystals of much larger grain size (also referred to as a large grain crystal region) than crystals of a semiconductor film crystallized by an excimer laser has been developed, in which the semiconductor film is irradiated with a continuous-wave (CW) laser or a pulsed laser with a repetition rate of 10 MHz or more to be processed into linear laser light, while the laser light is moved relatively to the semiconductor film. When this large grain crystal region is used as a channel region of a TFT in manufacturing the TFT, energy barriers against carriers (electrons or holes) decrease because fewer grain boundaries exist in the direction of the channel. As a result, the manufacture of a TFT that has a mobility of several hundreds of $cm^2/Vs$ becomes possible. (For example, see Patent Document 1: Japanese Published Patent Application No. 2005-191546).

SUMMARY OF THE INVENTION

However, in general, energy intensity distribution in a major-axis direction of a continuous-wave (CW) laser or a pulsed laser with a repetition rate of 10 MHz or more, which is used in crystallizing a semiconductor film, is Gaussian distribution, which does not have uniform energy intensity distribution. That is, on both ends in a major-axis direction of laser light, a region having low energy intensity distribution is formed. Therefore, when the semiconductor film is crystallized using the laser light, at the same time as formation of the large grain crystal region, only a crystal grain the grain size of which is comparatively small (hereinafter described as a small grain crystal) is to be formed in the region having low energy intensity distribution in the end region in the major-axis direction of the laser light.

Here, FIGS. 15A and 15B illustrate a schematic view of a surface of a semiconductor film when the semiconductor film is crystallized using laser light. FIG. 15A illustrates an irradiation track when the semiconductor film is irradiated with laser light 1501 used for laser irradiation. FIG. 15B illustrates an energy intensity distribution 1502 taken along a cross section A-A' of the laser light 1501. In general, laser light emitted from a laser oscillator having a $TEM_{00}$ mode (a single transverse mode) has energy intensity distribution of Gaussian distribution as illustrated in the energy intensity distribution 1502 of FIG. 15B, which does not have uniform energy intensity distribution. Note that FIG. 15B has a vertical axis which indicates an energy intensity, where an intensity (Y) is a threshold value in which a large grain crystal can be obtained at the irradiation and an intensity (X) is a threshold value in which a crystalline region can be formed.

In FIG. 15A, a region 1503 near the center in the major-axis direction of the laser light 1501 is irradiated with laser light having energy intensity higher than that of the threshold value (Y) in which a large grain crystal can be obtained, so that a large grain crystal region is formed. At this time, laser light with which a region 1504 near the end in the major-axis direction of the laser light is irradiated has energy intensity higher than that of the threshold value (X) in which a crystalline region can be formed and lower than that of the threshold value (Y). Therefore, in the region 1504 near the end in the major-axis direction of the laser light, a region which is not completely dissolved remains partially; thus, not a large grain crystal region as formed in the region near the center but only a small grain crystal is to be formed.

A small grain crystal region formed in such a manner, that is, the region near the end in the major-axis direction of the laser light is an aggregation of crystal grains the surface of which has marked unevenness; therefore, high characteristics cannot be obtained even when a semiconductor element is formed. In addition, since it is necessary to form a semiconductor element in the large grain crystal region in order to avoid this, it is apparent that there is limitation on layout. Therefore, it is necessary to control not to form the small grain crystal region in the entire region irradiated with the laser light.

Thus, in view of the above problems, it is an object of the present invention to provide a laser irradiation apparatus and a laser irradiation method that can form a large grain crystal region also in an end region in a major-axis direction of laser light by having high energy intensity distribution in the end region in the major-axis direction of the laser light.

Note that a direction of laser light that is extended longer is to be referred to as a major-axis direction or a longitudinal direction of the laser light, and a direction of a shorter axis is to be referred to as a minor-axis direction or a width direction of the laser light in this specification.

According to one feature of a structure relating to a laser irradiation apparatus of the present invention, a laser oscillator which oscillates laser light; an optical element which converges the laser light in one direction; and a means which shields an end region in a major-axis direction of the laser light, which is disposed between the optical element and an irradiation surface are included. In the laser irradiation apparatus, energy intensity distribution in the irradiation surface is precipitously high in the end region in the major-axis direction of the laser light, and energy intensity distribution in the irradiation surface is higher in the end region in the major-axis direction of the laser light than a central region in the major-axis direction of the laser light.

According to another feature of the structure relating to the laser irradiation apparatus of the present invention, a laser oscillator which oscillates laser light; an optical element which converges the laser light in one direction; and a means which shields an end region in a major-axis direction of the laser light, which is disposed between the optical element and an irradiation surface are included. In the laser irradiation apparatus, when a distance between the means which shields the end region in the major-axis direction of the laser light and the irradiation surface is L μm and a wavelength of the laser light oscillated from the laser oscillator is λ μm, the means which shields the end region in the major-axis direction of the laser light is disposed at a position which satisfies $0.5<L\lambda<100$; energy intensity distribution in the irradiation surface is precipitously high in the end region in the major-axis direction of the laser light; and energy intensity distribution in the irradiation surface is higher in the end region in the major-axis direction of the laser light than a central region in the major-axis direction of the laser light.

According to another feature of the structure relating to the laser irradiation apparatus of the present invention, a laser oscillator which oscillates laser light; an optical element which converges the laser light in one direction; and a means which shields an end region in a major-axis direction of the laser light, which is disposed between the optical element and an irradiation surface are included. In the laser irradiation apparatus, when a distance between the means which shields the end region in the major-axis direction of the laser light and the irradiation surface is L μm, the means which shields the end region in the major-axis direction of the laser light is disposed at a position which satisfies $1<L<200$; energy intensity distribution in the irradiation surface is precipitously high in the end region in the major-axis direction of the laser light; and energy intensity distribution in the irradiation surface is higher in the end region in the major-axis direction of the laser light than a central region in the major-axis direction of the laser light.

According to one feature of a structure relating to a laser irradiation method of the present invention, laser light is oscillated from a laser oscillator; the laser light emitted from the Laser oscillator passes through an optical element; the laser light which passes through the optical element passes through a means which shields an end region in a major-axis direction of the laser light; and, by passing through the means which shields an end region in a major-axis direction of the laser light, irradiation of laser light, in which energy intensity distribution is precipitously high in the end region in the major-axis direction of the laser light and energy intensity distribution is higher in the end region in the major-axis direction of the laser light than a central region in the major-axis direction of the laser light, is performed to an irradiation surface.

According to another feature of the structure relating to the laser irradiation method of the present invention, laser light is oscillated from a laser oscillator; the laser light emitted from the laser oscillator passes through an optical element; the laser light which passes through the optical element passes through a means which shields an end region in a major-axis direction of the laser light; by passing through the means which shields the end region in the major-axis direction of the laser light, irradiation of laser light, in which energy intensity distribution is precipitously high in the end region in the major-axis direction of the laser light and energy intensity distribution is higher in the end region in the major-axis direction of the laser light than a central region in the major-axis direction of the laser light, is performed to an irradiation surface; and, when a distance between the means which shields the end region in the major-axis direction of the laser light and the irradiation surface is L μm and a wavelength of the laser light oscillated from the laser oscillator is λ μm, the means which shields the end region in the major-axis direction of the laser light is disposed at a position which satisfies $0.5<L\lambda<100$.

According to another feature of the structure relating to the laser irradiation method of the present invention, laser light is oscillated from a laser oscillator; the laser light emitted from the laser oscillator passes through an optical element; the laser light which passes through the optical element passes through a means which shields an end region in a major-axis direction of the laser light; by passing through the means which shields the end region in the major-axis direction of the laser light, irradiation of laser light, in which energy intensity distribution is precipitously high in the end region in the major-axis direction of the laser light and energy intensity distribution is higher in the end region in the major-axis direction of the laser light than a central region in the major-axis direction of the laser light, is performed to an irradiation surface; and when a distance between the means which shields the end region in the major-axis direction of the laser light and the irradiation surface is L μm, the means which shields the end region in the major-axis direction of the laser light is disposed at a position which satisfies $1<L<200$.

In the present invention, either a continuous-wave laser oscillator or a pulsed laser oscillator can be used for the laser oscillator, and one or more of the following are used as the laser oscillator: a gas laser such as an Ar laser, a Kr laser, or an excimer laser; a laser using as a medium single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant; a glass laser, a ruby laser, an alexandrite laser, a Ti:sapphire laser, a copper vapor laser, or a gold vapor laser.

In particular, a laser having high interference such as single crystalline or polycrystalline (ceramic) $YVO_4$, YAG, $GdVO_4$, or YLF is appropriate for implementation of the present invention. The reason why the laser having high interference is appropriate is that the laser is appropriate to form energy intensity distribution, which is extremely precipitous, in an end region in a major-axis direction of laser light.

In the pulsed laser oscillator, although a frequency band of several tens to several hundreds Hz is generally used, a pulsed laser with a repetition rate of 10 MHz or more may also be used.

When a pulsed laser having a high repetition rate is used, there is such an advantage: a period after a semiconductor film is irradiated with laser light and before the semiconductor film is completely solidified is said to be several tens to several hundred n sec.

With a pulsed laser having a low repetition rate, a semiconductor film is irradiated with the next pulse after being melted and solidified by laser light. Therefore, after the semiconductor film is irradiated with each pulse, crystal grains grow radially in a centrosymmetric manner at the time of recrystallization. Then, since grain boundaries are formed at boundaries between the adjacent crystal grains, the surface of the semiconductor film becomes uneven.

On the other hand, when a pulsed laser with a high repetition rate is used, laser light is delivered to a semiconductor film before the semiconductor film melted by the previous laser light is solidified. Therefore, unlike in the case where a pulsed laser with a low repetition rate is used, an interface between a solid phase and a liquid phase in the semiconductor film can be moved continuously. Consequently, a semiconductor film having crystal grains, which grow continuously in a direction where the laser light is moved, can be formed.

In addition, one of features of the pulsed laser is that peak output per pulse can be raised by increasing the repetition rate. Therefore, conversion efficiency of laser light into a second harmonic can be significantly increased even in the case where the average output is comparatively low. Accordingly, since a harmonic with high output can be obtained easily, the productivity can be improved significantly.

In the case where a laser oscillator that includes a single-crystal medium is used, laser light is formed into laser light with a length of 0.5 to 1 mm in a major-axis direction and a length of less than or equal to 20 μm, preferably less than or equal to 10 μm, in a minor-axis direction on an irradiation surface. The laser beam is moved in the minor-axis direction. Consequently, an aggregation of crystal grains each having a width of 10 to 30 μm in a scanning direction of the laser light and approximately 1 to 5 μm in a direction perpendicular to the scanning direction can be formed the entire surface of a region irradiated with the laser light. In this way, a crystal grain with a similar size to a crystal grain obtained by using a continuous-wave (CW) laser can be obtained. By forming a crystal grain extending long in the scanning direction of the laser light, it is possible to form a semiconductor film having almost no crystal grain boundaries at least in a moving direction of carriers in a TFT.

In the case where a laser oscillator that includes a polycrystalline medium is used, laser light can be emitted with extremely high output. In such a case, the size of the laser light can be enlarged. The length of a minor axis of the laser light may be set to be less than or equal to 1 mm, and that of the major axis is set so that a semiconductor film can be favorably annealed.

In the present invention, as the optical element, a diffractive optical element such as a holographic optical element or a binary optical element, or a cylindrical lens can be used.

Moreover, a thin film transistor (TFT) is formed with a crystalline semiconductor film formed by applying the present invention, and a semiconductor device is manufactured by using the TFT. As the semiconductor device, typically, a central processing unit (CPU), a memory, an IC, an RFID element, a pixel, a driver circuit, and the like can be given. Further, by incorporating these semiconductor devices, various electronic devices can be formed, such as a television, a computer, and a mobile information-processing terminal.

With the use of the laser irradiation apparatus and the laser irradiation method of the present invention, a region where energy intensity distribution is precipitously high in an end region in a major-axis direction of laser light in the irradiation surface can be formed. Therefore, by applying the present invention, a surface of an amorphous semiconductor film is irradiated with laser light, whereby large grain crystals can be formed in the entire region irradiated with the laser light. Thus, the laser irradiation can be performed favorably.

In addition, a crystalline grain region (a small grain crystal region) having an uneven surface, which is rough, formed in the end region in the major-axis direction of the laser light, comes not to be formed, and coverage in forming a thin film over a crystallized semiconductor film will be favorable in a subsequent step. The entire region irradiated with the laser light can be used to form a semiconductor element; thus, a rule of a circuit design is relaxed.

BRIEF DESCRIPTION OF THE DRAWINGS

In the accompanying drawings:

FIGS. 8A and 8B are views illustrating an example of a manufacturing method of a semiconductor device using a laser irradiation apparatus of the present invention;

FIGS. 10A and 10B are views illustrating an example of a manufacturing method of a semiconductor device using a laser irradiation apparatus of the present invention;

DETAILED DESCRIPTION OF THE INVENTION

Figure 1A:
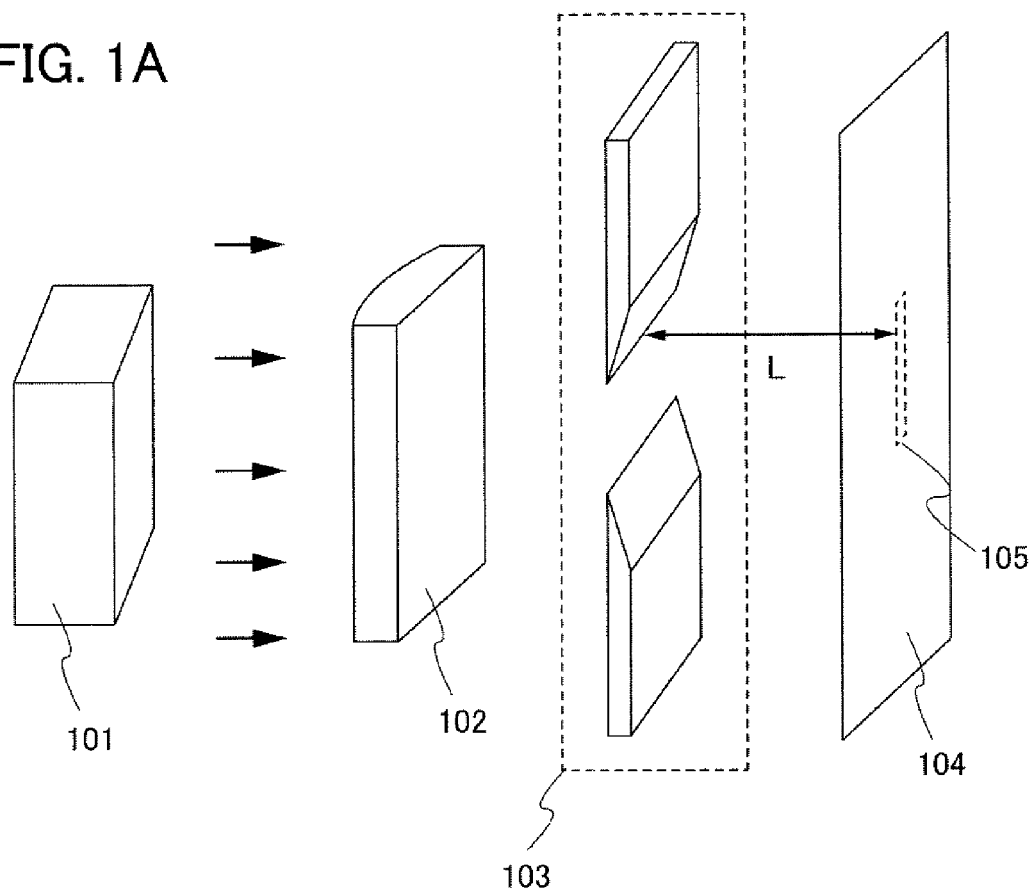
FIGS. 1A and 1B are views each describing an example of a laser irradiation apparatus of the present invention.

Embodiment modes of the present invention will be described in detail with reference to the accompanying drawings. However, the present invention is not limited to the following description, and those skilled in the art can easily understand that modes and details of the present invention can be changed in various ways without departing from the purpose and the scope of the present invention. Therefore, the present invention should not be interpreted as being limited to the description of the embodiment modes below. Note that the same portions or portions having the same function in the structure of the present invention described below are denoted by the same reference numerals in common among different drawings and repetitive description thereof will be omitted.

(Embodiment Mode 1)

This embodiment mode will show an example of a laser irradiation apparatus and a laser irradiation method of the present invention.

Figure 1B:
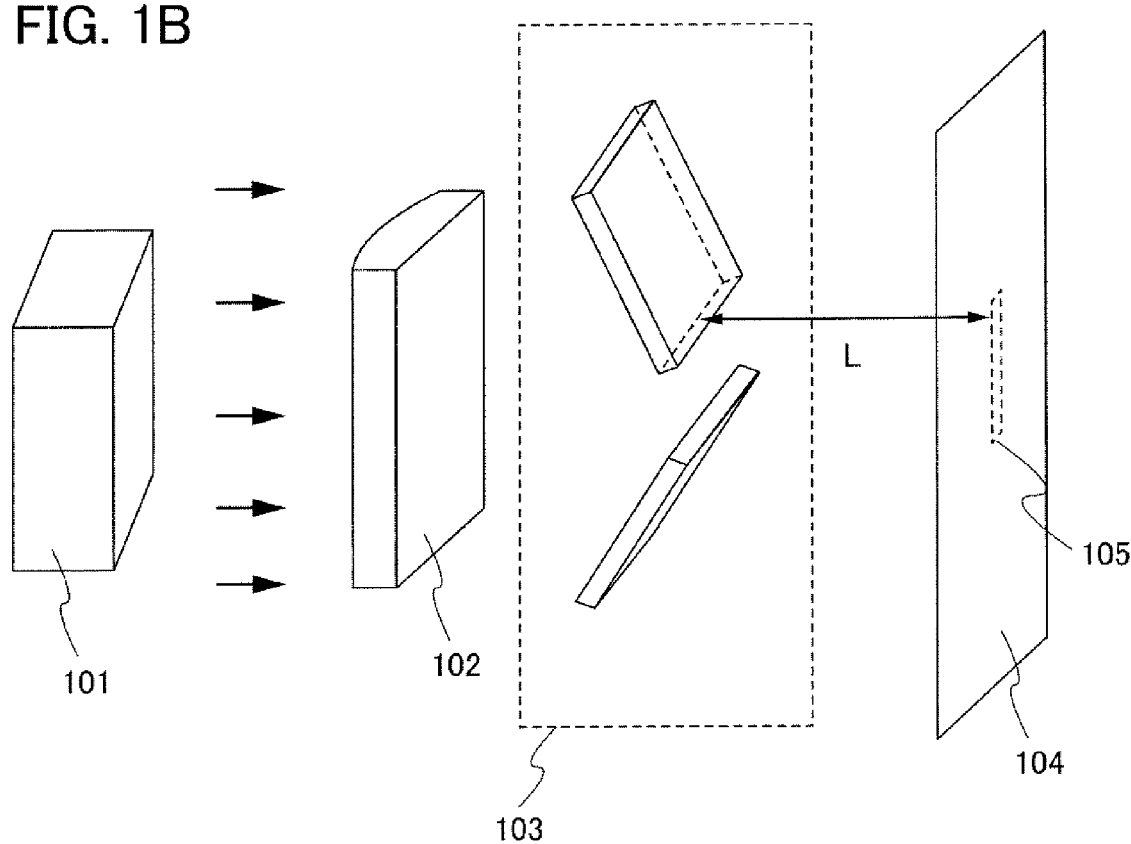

A laser irradiation apparatus illustrated in FIGS. 1A and 1B has a laser oscillator 101, an optical element 102, and a slit 103. In this embodiment mode, the case will be described where the slit 103 is used as a means which shields an end region in a major-axis direction of laser light which is emitted from a laser oscillator.

The laser oscillator 101 used in this embodiment mode is not particularly limited, and either a continuous-wave laser oscillator or a pulsed laser oscillator can be used. For example, a laser oscillated from one or more of the following can be used: a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant; a glass laser, a ruby laser, an alexandrite Laser, a Ti:sapphire laser, a copper vapor laser, or a gold vapor laser. Note that a laser having high interference such as single crystalline or polycrystalline (ceramic) $YVO_4$, YAG, $GdVO_4$, or YLF is appropriate, which is preferable. This is because a region where energy intensity distribution is precipitously high is formed in the end region in the major-axis direction of laser light when such a laser is used.

Laser light oscillated from the laser oscillator 101 enters into the optical element 102. In this embodiment mode, the case where a cylindrical lens is used as the optical element 102 is described. Note that the cylindrical lens operates so as to converge laser light in one direction and forms a cross-sectional shape of the laser light into a linear shape relative to an irradiation surface.

Light in the end region in the major-axis direction of the laser light, which passes through the optical element 102, passes through the slit 103 disposed between the cylindrical lens and the irradiation surface, thereby being shielded. An irradiation surface 104 is irradiated with laser light that is not shielded by the slit 103.

Figure 2A:
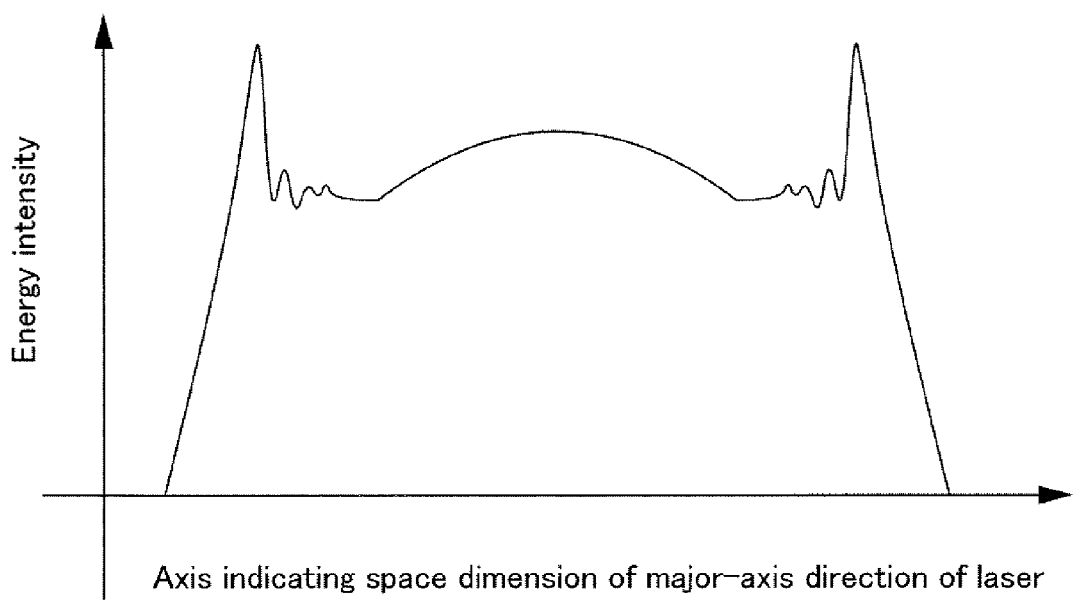
FIGS. 2A and 2B are graphs each illustrating energy intensity distribution in a major-axis direction of laser light.

FIG. 2A illustrates energy intensity distribution in the major-axis direction of the laser light with which the irradiation surface 104 is irradiated. As illustrated in FIG. 2A, in the end region in the major-axis direction of the laser light, a region where energy intensity distribution is precipitously high is formed. This is because the end region in the major-axis direction of the laser light is shielded using the slit 103, so that a phenomenon referred to as diffraction due to laser interference occurs. The region where the energy intensity distribution is precipitously high is formed, so that decrease in energy intensity distribution in the end region of the laser light can be prevented. Therefore, the entire surface of the region irradiated with the laser light can be irradiated with laser light having enough energy intensity.

The energy intensity distribution in the end region in the major-axis direction of the laser light of this case is increased by 30 percent in comparison with the case in which the slit 103 is not disposed.

In addition, the energy intensity distribution in the end region in the major-axis direction of the laser light can be made higher than energy intensity distribution in a central region in the major-axis direction of the laser light by using the slit 103. Therefore, even when heat is diffused outside of a boundary of an irradiation region of the laser light in irradiating a substrate with the laser light, decrease in temperature of a substrate surface in the boundary region can be prevented. Thus, a surface of an amorphous semiconductor film is irradiated with such laser light, whereby a small grain crystal region can be prevented from being formed near an end of the irradiation region of the laser light. Therefore, a large grain crystal region can be formed in an entire region of a surface of the semiconductor film irradiated with the laser light. Further, since the entire region irradiated with the laser light can be used to form a semiconductor element, a rule of a circuit design is relaxed.

In addition, the entire energy intensity distribution of the laser light is increased and the energy intensity distribution in the end region in the major-axis direction of the laser light is further increased, whereby a microcrystalline grain the surface of which has less unevenness can be formed. In addition, an ablation process (a process using a phenomenon that molecular bond in a portion irradiated with laser light, that is, a portion that absorbs laser light is broken, photodecomposition of the portion occurs, and the portion is vaporized) can also be performed. Accordingly, a crystalline grain region (a small grain crystal region) having an uneven surface, which is rough, formed in the end region in the major-axis direction of the laser light, comes not to be formed and coverage in forming a thin film over a crystallized semiconductor film will be favorable in a subsequent step. The width of the end region is within several μm, which is extremely narrow; therefore, almost the entire region irradiated with the laser light can be used to form a semiconductor element; thus, a rule of a circuit design is relaxed.

In this embodiment, the laser light is formed using the cylindrical lens; however, the optical element 102 is not particularly limited as long as an optical element that converges laser light in one direction (forms a cross section of laser light into a linear shape or a rectangular shape) is used. For example, a diffractive optical element may be used. As a typical example of a diffractive optical element, a holographic optical element, a binary optical element, and the like can be given. A diffractive optical element is also referred to as a diffractive optics or a diffractive optics element, which is an element that can obtain a spectrum using diffraction of light. Then, the laser light emitted from the laser oscillator can be formed into linear or rectangular laser light with uniform energy intensity distribution by using the diffractive optical element.

Figure 2B:
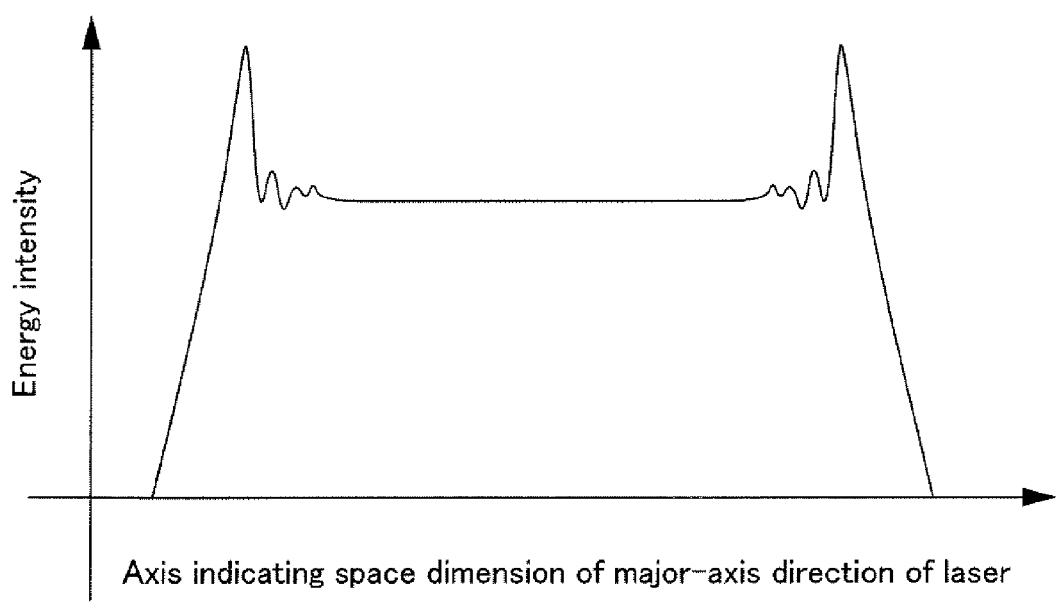

When the laser light having the linear shape or the rectangular shape with the uniform energy intensity distribution is made to pass through the slit used in this embodiment mode by the diffractive optical element, as illustrated in FIG. 2B, the region where the energy intensity distribution is precipitously high in the end region in the major-axis direction of the laser light in the irradiation surface can be formed.

In addition, as the convexity of the cylindrical lens, a cylindrical lens having a convex surface either on an incidence side or an emission side, or having convex surfaces on both sides may be used. However, in consideration of low aberration and accuracy, a cylindrical lens having a convex surface on an incidence side is preferably used.

The slit 103 is disposed at a position apart from the irradiation surface 104 by a distance L [μm]. When a wavelength of the laser light oscillated from the laser oscillator 101 is to be λ [μm], a growth direction of crystals and a crystallization position can be controlled by disposing the slit 103 at a position that satisfies $0.5 < L\lambda < 100$. Accordingly, the crystallization direction can be made constant, a large grain crystal region can be formed on a surface of a semiconductor film, and a surface of the crystallized film can be planarized.

The slit 103 used in this embodiment mode is not particularly limited. A slit that has a structure or a shape capable of shielding an end region in a major-axis direction of laser light when the laser light passes through the slit can be used. For example, light shielding is performed using the plate slit 103 as illustrated in FIGS. 1A and 1B or a slit having a rectangular opening. The slit 103 can adjust the position depending on kinds of laser light or energy, and the size of the opening of the slit 103 can be adjusted. In the laser irradiation apparatus of the present invention, the slit 103 is provided so that the opening is parallel to a scanning direction of a beam spot 105, and the width of the opening of the slit is to be constant in a scanning range. Accordingly, the end region in the major-axis direction of the laser light can be shielded and the length in the major-axis direction of the beam spot 105 can be adjusted at the same time.

In addition, the slit can also be formed using a reflecting mirror. Deformation of the slit can be prevented without absorbing heat by using a reflecting mirror. Therefore, stable laser light can be obtained. As illustrated in FIG. 1B, a reflecting mirror may be disposed by inclining a reflective surface to a direction that laser light make incidence. Moreover, laser light that is reflected by the reflecting mirror is preferably absorbed using a damper.

By using the laser irradiation apparatus and the laser irradiation method of this embodiment mode, the region where the energy intensity distribution is precipitously high in the end region in the major-axis direction of the laser light can be formed. Therefore, a large grain crystal region can be formed in all regions irradiated with the laser light, so that the laser irradiation can be favorably performed. For example, by using the laser irradiation apparatus and the laser irradiation method described in this embodiment mode, a large grain crystal region can be formed in all regions irradiated with the laser light in crystallizing a semiconductor film; thus, the entire surface of the semiconductor film can be favorably crystallized.

(Embodiment Mode 2)

This embodiment mode will describe a manufacturing method of a TFT using the laser irradiation apparatus or the laser irradiation method described in Embodiment Mode 1 with reference to drawings. Note that this embodiment will describe a manufacturing method of a top-gate (staggered) TFT; however, the present invention is applicable not only to the top-gate TFT but also, similarly, to a bottom-gate (inverted staggered) TFT or the like.

Figure 5A:
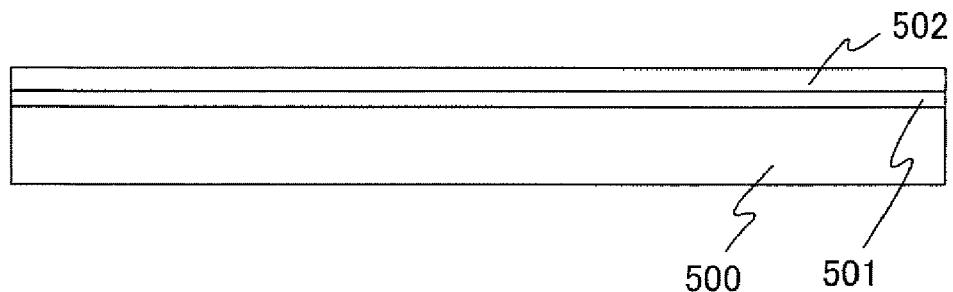
FIGS. 5A to 5D are views illustrating an example of a manufacturing method of a crystalline semiconductor film using a laser irradiation apparatus of the present invention.

As illustrated in FIG. 5A, a base film 501 is formed over a substrate 500 having an insulating surface. In this embodiment mode, a glass substrate is used as the substrate 500. As the substrate used here, a glass substrate made of barium borosilicate glass, aluminoborosilicate glass, or the like; a quartz substrate; a ceramic substrate; a stainless steel substrate; or the like can be used. Although a substrate made of a synthetic resin typified by acrylic or plastic which is represented by PET, PES, or PEN tends to have lower heat resistance than other substrates in general, the substrate can be used as long as the substrate can resist the process of this step.

The base film 501 is provided in order to prevent the diffusion of alkaline earth metal or alkali metal such as sodium from the substrate 500 into the semiconductor. Alkaline earth metal and alkali metal cause adverse effects on characteristics of a semiconductor element when such metal is in the semiconductor film. Therefore, the base film 501 is formed by using an insulating film which can prevent the diffusion of alkaline earth metal and alkali metal into the semiconductor, such as a silicon oxide film, a silicon nitride film, or a silicon nitride oxide film. The base film 501 is formed either in a single-layer or stacked-layer structure. In this embodiment, a silicon nitride oxide film is formed with a thickness of 10 to 400 nm by a plasma CVD (Chemical Vapor Deposition) method.

It is effective to provide the base film in order to prevent the diffusion of the impurity when the substrate 500 containing even a little amount of alkaline earth metal or alkali metal, such as a glass substrate or a plastic substrate, is used. However, when a substrate in which the diffusion of the impurity does not lead to a significant problem, for example a quartz substrate, is used, the base film 501 is not necessarily provided.

Next, an amorphous semiconductor film 502 is formed over the base film 501. The amorphous semiconductor film 502 is formed with a thickness of 25 to 100 nm (preferably thickness of 30 to 60 nm) by a sputtering method, an LPCVD method, a plasma CVD method, or the like. The amorphous semiconductor film used here can be formed using silicon, silicon germanium (SiGe), or the like. Note that silicon is used here. In the case where silicon germanium (SiGe) is used, it is preferable that the concentration of germanium be approximately 0.01 to 4.5 atomic %.

Figure 5B:
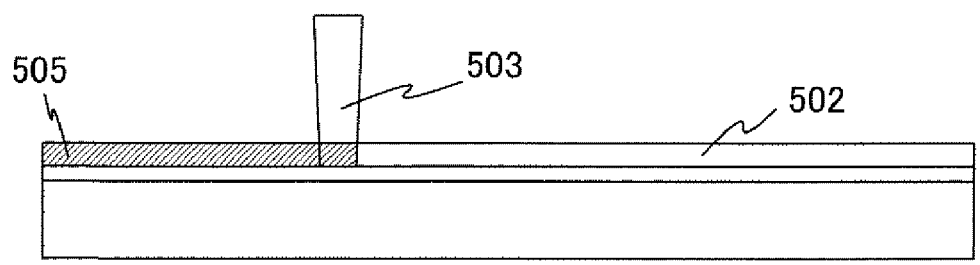

Subsequently, as illustrated in FIG. 5B, the amorphous semiconductor film 502 is irradiated with laser light 503 to be crystallized.

Here, an example of a laser irradiation apparatus and a laser irradiation method used for the laser irradiation is described with reference to FIG. 3. The laser irradiation apparatus illustrated in FIG. 3 has a laser oscillator 101, an optical element 102, a slit 103, a mirror 302, a suction stage 306, an X-axis stage 307, and a Y-axis stage 308. As the laser oscillator 101, the optical element 102, and the slit 103, ones similar to those illustrated in FIGS. 1A and 1B can be used. Note that the mirror 302 is not necessarily provided. Further, the mirror 302 may not be provided, if not necessary.

In this embodiment mode, a substrate in which a semiconductor film 305 is formed is provided over the suction stage 306. Note that an insulating material is used as a material of the substrate. In addition, an amorphous semiconductor film may be used as the semiconductor film 305. However, a microcrystal semiconductor film or a crystalline semiconductor film can also be used. The entire surface of the semiconductor film 305 can be irradiated with laser light by scanning the suction stage 306 in X-axis or Y-axis direction along a surface of the semiconductor film 305 using the X-axis stage 307 and the Y-axis stage 308. Thus, the entire surface of the semiconductor film 305 can be crystallized favorably.

This embodiment mode has a structure in which the substrate in which the semiconductor film 305 is formed is moved using the X-axis stage 307 and the Y-axis stage 308. Note that any one of the following methods can be used in order to move the laser light: an irradiation system moving method in which the substrate as an object is fixed while an irradiation position of the laser light is moved; an object moving method in which the irradiation position of the laser light is fixed while the substrate is moved; and a method in which these two methods are combined.

In this embodiment mode, a continuous-wave (CW) laser (an Nd:YVO$_4$ laser having a second harmonic (wavelength: 532 nm)) is used as the laser light 503. It is not necessary to limit particularly to a second harmonic; however, a second harmonic is superior to a further higher order harmonic in terms of energy efficiency.

When the semiconductor film is irradiated with the continuous-wave (CW) laser, energy is continuously provided to the semiconductor film. Therefore, once the semiconductor film has been brought to a molten state, the molten state can be maintained. Further, an interface between a solid phase and a liquid phase of the semiconductor film can be moved by scanning the continuous-wave (CW) laser light, so that crystal grains long in one direction, to which the laser moves, can be formed.

Not only the above laser light but also the continuous-wave (CW) laser shown in Embodiment Mode 1 or a pulsed laser with a repetition rate of 10 MHz or more can also be used.

Figure 3:
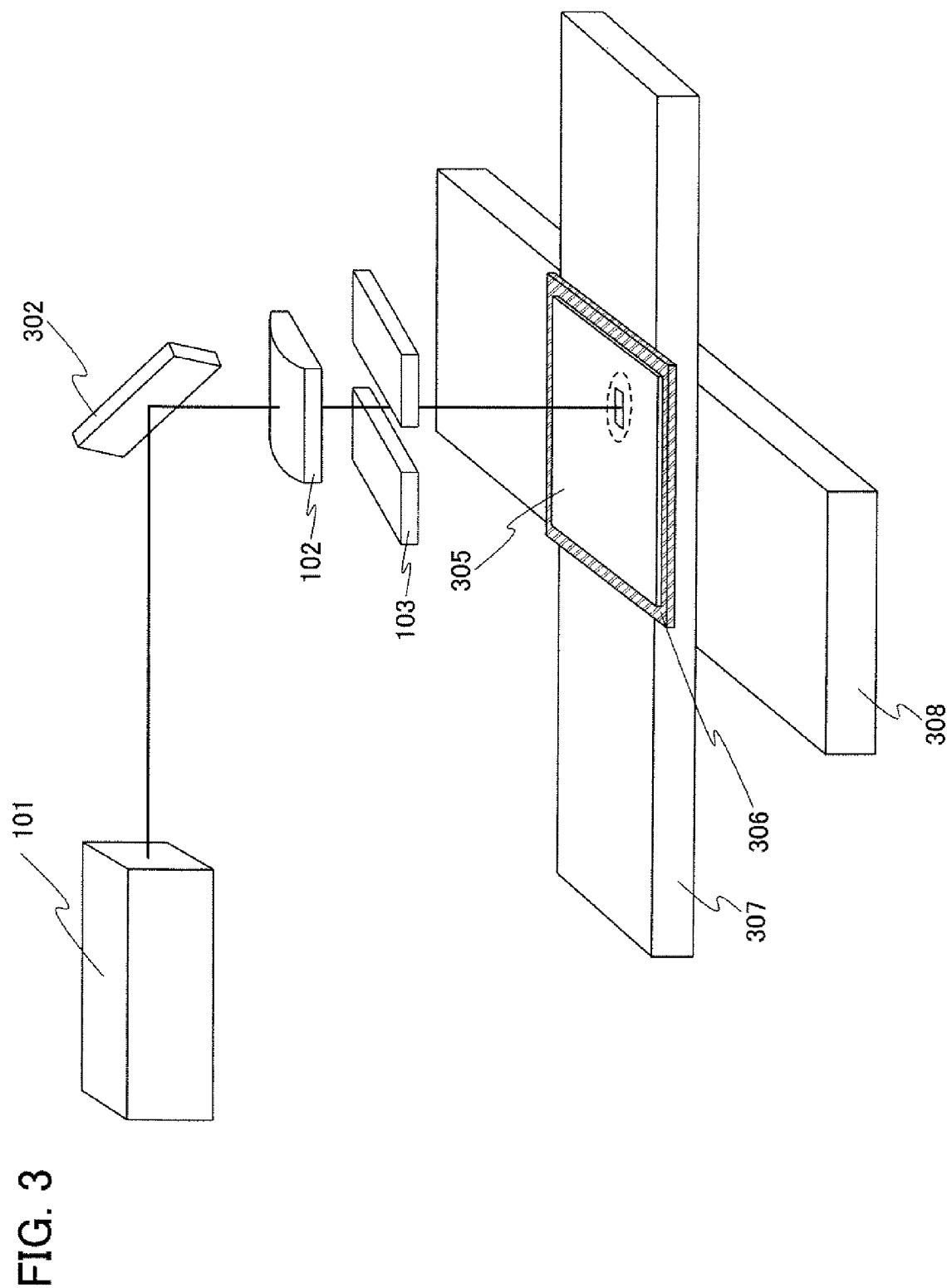
FIG. 3 is a view describing an example of a laser irradiation apparatus of the present invention.

When the highest value of energy intensity distribution of the laser light is to be 100%, the size of an opening of the slit 103 used in FIG. 3 may be adjusted so that the laser light is shielded at greater than or equal to 60%, preferably greater than or equal to 80%, of the highest value of the energy intensity distribution of the laser light. When the laser light is shielded at greater than or equal to 80% of the highest value of the energy intensity distribution of the laser light, energy intensity distribution in the end region in the major-axis direction of the laser light can be made higher than energy intensity density in a central part in the major-axis direction of the laser light. Consequently, a large grain crystal can be formed in the entire region of the semiconductor surface irradiated with the laser. In addition, a microcrystal grain the surface of which has less unevenness can be formed or an ablation process can be performed.

In this embodiment mode, a second harmonic (wavelength: 532 nm) of an Nd:YVO$_4$ laser is used for crystallization of the semiconductor film. Therefore, in order to perform crystal growth in the major-axis direction of the laser light, the distance L between the slit and the irradiation surface is 1 to 200 μm, preferably 3 to 100 μm, more preferably 10 to 50 μm, and much more preferably 30 to 50 μm. In this case, the wavelength λ of the laser light is not limited to 532 nm. For example, an appropriate range of the above distance L is applied even in the case of the wavelength 527 nm like a second harmonic of an YLF laser. Further, the diffraction phenomenon depends on the wavelength of the laser light, and there is an inversely proportional relationship between the wavelength of the laser light λ and the distance L to obtain a similar diffraction image. Therefore, the appropriate range of the distance L which satisfies 0.5<Lλ<100 may be used by calculation as appropriate when laser light, the wavelength of which differs vastly from that of the above example, is used.

The laser light emitted from the laser oscillator is converged in one direction by the optical element, and a cross-sectional shape of the laser light is formed into a linear shape relative to the irradiation surface. After that, the semiconductor film 305 is irradiated with the laser light after passing through the slit 103 disposed between the optical element 102 and the semiconductor film 305.

With the use of the laser irradiation apparatus of this embodiment mode, a region where the energy intensity distribution is precipitously high in the end region in the major-axis direction of the laser light can be formed. By scanning the laser light to the amorphous semiconductor film, not only a crystal grain which is continuously grown in a lateral direction in both the ends in the major-axis direction of the laser light but also formation of a small grain crystal region or unevenness can be suppressed in a boundary of the adjacent laser irradiation regions. In such a manner, laser irradiation is favorably performed to the entire surface of the semiconductor film 305 by irradiating the semiconductor film with the laser light. Consequently, characteristics of the semiconductor device manufactured using this semiconductor film, which is favorable and uniform, can be obtained.

Figure 4:
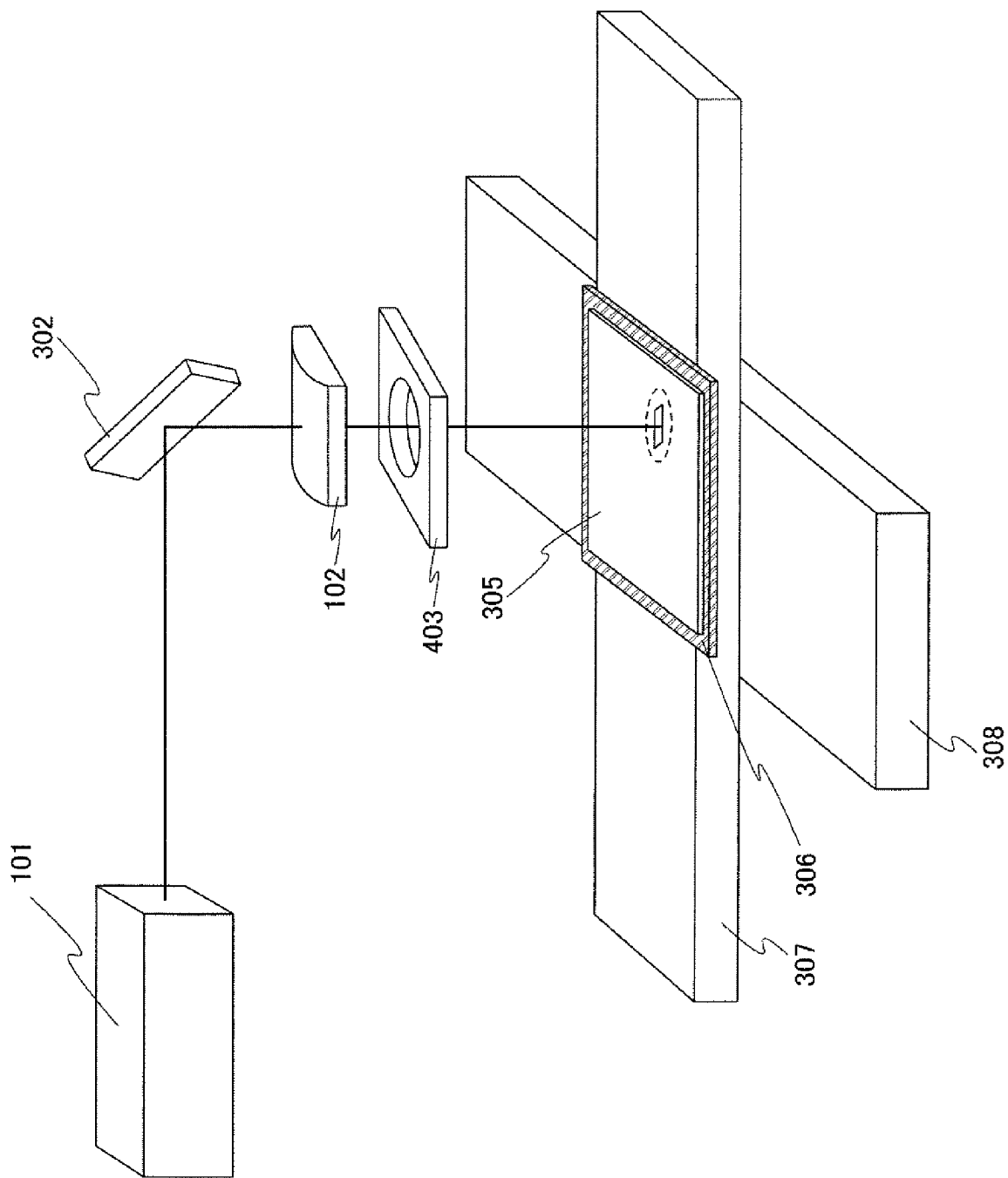
FIG. 4 is a view describing an example of a laser irradiation apparatus of the present invention.

The case where the plate slit is described with reference to FIGS. 1A and 1B and FIG. 3 is used; however, the present invention is not limited thereto and such a slit 403 as the opening of which is to be circular or elliptical may be used as illustrated in FIG. 4. A laser irradiation apparatus illustrated in FIG. 4 has a laser oscillator 101, an optical element 102, a slit 403, a mirror 302, a suction stage 306, an X-axis stage 307, and a Y-axis stage 308. As the laser oscillator 101, the optical element 102, the mirror 302, the suction stage 306, the X-axis stage 307, and the Y-axis stage 308, ones similar to those illustrated in FIG. 3 can be used.

Figure 5C:
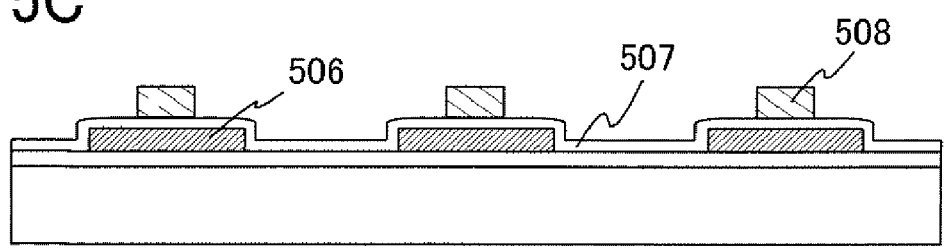

After that, as illustrated in FIG. 5C, a crystalline semiconductor film 505 formed by laser irradiation is etched into a predetermined shape, thereby forming an island-shaped semiconductor film 506. Moreover, a gate insulating film 507 is formed so as to cover this island-shaped semiconductor film 506.

The gate insulating film 507 only needs to be an insulating film containing at least oxygen or nitrogen and may have a single layer or multilayer structure. The gate insulating film 507 can be formed by a plasma CVD method or a sputtering method. In this embodiment mode, a silicon nitride oxide film ($SiN_xO_y$, (x>y, x and y=1, 2, 3 . . . )) and a silicon oxynitride film ($SiO_xN_y$, (x>y, x and y=1, 2, 3 . . . ) are continuously formed by a plasma CVD method with a total thickness of 115 nm. In the case where a TFT with a channel length of 1 μm or less (such a TFT is also referred to as a submicron TFT) is formed, the gate insulating film is preferably formed with a thickness of 10 to 50 nm.

Next, a conductive film is formed over the gate insulating film 507 and etched into a predetermined shape, thereby forming a gate electrode 508. The conductive film formed over the gate insulating film 507 may be a film having conductivity, and a stacked-layer film of tungsten and tantalum nitride is used in this embodiment mode. However, a conductive film in which Mo (molybdenum), Al (aluminum), and Mo are sequentially stacked by using Al and Mo, or a conductive film in which Ti (titanium), Al, and Ti are sequentially stacked by using Ti and Al may be used. Moreover, an element of gold (Au), silver (Ag), copper (Cu), platinum (Pt), aluminum (Al), molybdenum (Mo), tungsten (W), or titanium (Ti), or an alloy or compound material containing the above element as its main component can also be used. Further, these materials may be stacked.

Then, a resist mask for pattern processing of this conductive film is formed. First, coating of a photoresist is performed by a spin coating method or the like over the conductive film and then light exposure is performed. Next, heat treatment (pre-baking) is performed to the photoresist. The temperature for the pre-baking is set to 50 to 120° C., which is lower than the temperature at post-baking to be performed later. In this embodiment mode, the heat temperature is set to 90° C. and the heat time is set to 90 seconds.

Subsequently, the light-exposed resist is developed by dropping a liquid developer or spraying a liquid developer from a spray nozzle onto the photoresist.

After that, heat treatment (post-baking) is performed at 125° C. for 180 seconds to the developed photoresist. Thus, moisture and the like remaining in the resist mask are removed and, at the same time, the stability against heat is increased. The resist mask is formed according to these steps. Based on the resist mask, the conductive film is etched into a predetermined shape to form the gate electrode 508.

As another method, the gate electrode 508 may be formed directly on the gate insulating film 507 by a printing method capable of discharging a material at a predetermined location or a droplet discharging method typified by an ink jet method.

As the material to be discharged, a conductive material which is dissolved or dispersed in a solvent is used. As the material of the conductive film, at least one kind of gold (Au), silver (Ag), copper (Cu), platinum (Pt), aluminum (Al), chromium (Cr), palladium (Pd), indium (In), molybdenum (Mo), nickel (Ni), lead (Pb), iridium (Ir), rhodium (Rh), tungsten (W), cadmium (Cd), zinc (Zn), iron (Fe), titanium (Ti), zirconium (Zr), barium (Ba), or the like, or alloy containing any of these elements is used. As the solvent, may be any of esters such as butyl acetate or ethyl acetate, alcohols such as isopropyl alcohol or ethyl alcohol, an organic solvent such as methyl ethyl ketone or acetone, or the like can be used.

The viscosity of the composition is set to be less than or equal to 0.3 Pa·s. This is to prevent the composition from being dried and to facilitate the discharging of the composition from a nozzle. The viscosity and surface tension of the composition may be adjusted as appropriate in accordance with the solvent to be used and the intended purpose.

Figure 5D:
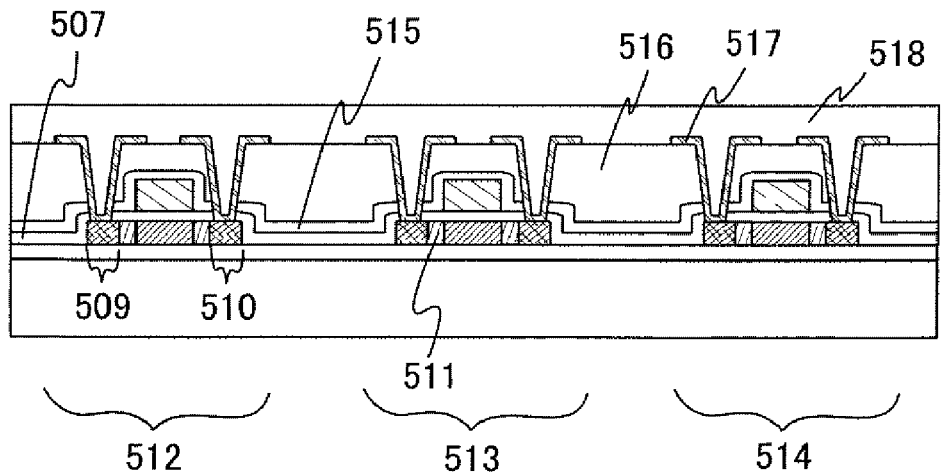

Then, the gate electrode 508 or the resist used when the gate electrode 508 is formed is used as the mask to selectively add impurities imparting n-type or p-type conductivity into the island-shaped semiconductor film 506. Thus, a source region 509, a drain region 510, an LDD region 511, and the like are formed. By the above steps, N-channel TFTs 512 and 513, and a P-channel TFT 514 are formed over one substrate as illustrated in FIG. 5D.

Subsequently, an insulating film 515 is formed as protective films of the N-channel TFTs 512 and 513, and the P-channel TFT 514. This insulating film 515 is formed with a thickness of 100 to 200 nm in a single-layer or stacked-layer structure of a silicon nitride film or a silicon nitride oxide film, by a plasma CVD method or a sputtering method. In the case where a silicon nitride oxide film and a silicon oxynitride film are combined, these films can be continuously formed by switching gas. In this embodiment mode, a silicon oxynitride film with a thickness of 100 nm is formed by a plasma CVD method. By providing the insulating film 515, it is possible to obtain a blocking effect to prevent the intrusion of various ionic impurities in addition to oxygen and moisture in the air.

Subsequently, an insulating film 516 is formed. Here, the insulating film 516 can be formed by using an organic resin film such as polyimide, polyamide, BCB (benzocyclobutene), acrylic, or siloxane, the coating of which is performed by an SOG (Spin On Glass) method or a spin coating method. Moreover, an inorganic interlayer insulating film (an insulating film containing silicon such as silicon nitride or silicon oxide), a low-k (low dielectric) material, or the like can also be used. Since the insulating film 516 is formed with a main purpose for relaxing unevenness due to TFTs formed over the glass substrate to make the insulating film 516 flat, a film superior in flatness is preferable. Note that siloxane is a material whose skeletal structure includes a bond of silicon (Si) and oxygen (O) and whose substituent is either an organic group including at least hydrogen (such as an alkyl group or an aryl group) or a fluoro group.

Further, the gate insulating film 507, the insulating film 515, and the insulating film 516 are pattern processed by a photolithography method, thereby forming contact holes that reach the source region 509 and the drain region 510.

Next, a conductive film is formed with a conductive material and pattern processed, thereby forming a wiring 517. After that, an insulating film 518 is formed as a protective film. Thus, TFTs as illustrated in FIG. 5D is completed.

By manufacturing a TFT with the crystalline semiconductor film which is manufactured using the laser irradiation apparatus of this embodiment mode, the performance of the TFT can be drastically improved. For example, since the number of crystal grain boundaries included in a channel formation region can be decreased, it is possible to obtain electric field-effect mobility (also referred to as mobility, simply) which is greater than or equal to that of a TFT using a single-crystal semiconductor and to decrease variation in an on-current value (the amount of drain current flowing when a TFT is in an on-state), an off-current value (the amount of drain current flowing when a TFT is in an off-state), threshold voltage, an S value, and electric field-effect mobility. With these advantageous effects, electrical characteristics of the TFT improves and the operating characteristic and reliability of the semiconductor device using the TFT improve. In particular, since there are almost no grain boundaries in a direction where the laser beam is moved, TFT characteristics preferably improve when channel formation region of the TFT is formed along this direction.

The method for manufacturing a semiconductor device by using the laser irradiation method of the present invention is not limited to the above manufacturing process of a TFT. In addition, a crystallization step using a catalytic element may be provided prior to the crystallization by the laser light. As the catalytic element, nickel (Ni), germanium (Ge), iron (Fe), palladium (Pd), tin (Sn), lead (Pb), cobalt (Co), platinum (Pt), copper (Cu), or gold (Au) can be used.

The laser irradiation may be performed after the catalytic element is added to promote the crystallization through heat treatment, or the heat treatment may be omitted. Alternatively, after the heat treatment, a laser process may be performed while keeping the temperature.

Although this embodiment mode shows the example of using the laser irradiation apparatus of the present invention to crystallize the semiconductor film, the laser irradiation apparatus of the present invention may be used to activate the impurity elements doped to the semiconductor film. Moreover, the method for manufacturing a semiconductor device according to the present invention can also be applied to a method for manufacturing an integrated circuit or a semiconductor display device.

According to the present invention, laser irradiation is performed to the semiconductor film homogeneously. Therefore, if TFTs are manufactured using the semiconductor film by the method according to the present invention, all the TFTs have favorable characteristics and the characteristics of the respective TFTs are uniform.

This embodiment can be freely combined with any of other embodiment modes and embodiments.

(Embodiment Mode 3)

This embodiment mode will describe a manufacturing method of a semiconductor device using the laser irradiation apparatus or a laser irradiation method shown in Embodiment Mode 1 with reference to drawings.

Figure 6A:
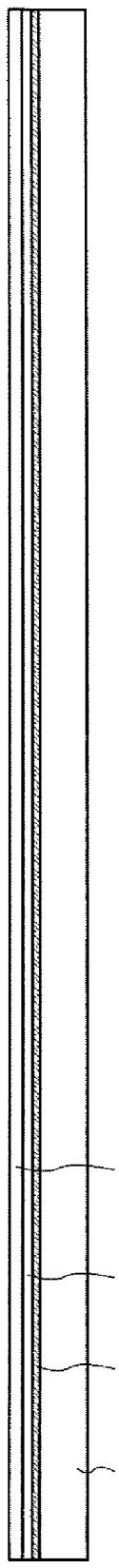
FIGS. 6A to 6D are views illustrating an example of a manufacturing method of a semiconductor device using a laser irradiation apparatus of the present invention.

First, a peeling layer 602 is formed over a substrate 601 made of glass by a sputtering method as illustrated in FIG. 6A. The peeling layer 602 can be formed by a sputtering method, a low-pressure CVD method, a plasma CVD method, or the like. In this embodiment mode, the peeling layer 602 is formed with amorphous silicon in thickness of approximately 50 nm by a low-pressure CVD method. The material of the peeling layer 602 is not limited to silicon and a material which can be selectively etched away (such as W or Mo) may be used. The thickness of the peeling layer 602 preferably ranges from 50 to 60 nm.

Next, a base insulating film 603 is formed over the peeling layer 602. The base insulating film 603 is provided so as to prevent alkaline earth metal or alkali metal such as Na included in the substrate 601 from diffusing to the semiconductor film. Alkali metal and alkaline earth metal cause adverse effects on characteristics of a semiconductor element such as a TFT when the metal is in the semiconductor film. Moreover, the base insulating film 603 also has a function to protect the semiconductor element in a later step of peeling the semiconductor element. The base insulating film 603 can be formed with a single insulating film or a plurality of insulating films that are stacked. Therefore, an insulating film which can suppress the diffusion of alkali metal and alkaline earth metal into the semiconductor, such as a silicon oxide film, a silicon nitride film, a silicon oxide film containing nitrogen (SiON), or a silicon nitride film containing oxygen (SiNO) is used.

Next, an amorphous semiconductor film 604 is formed over the base insulating film 603. The amorphous semiconductor film 604 is formed with a thickness of 25 to 200 nm (preferably, with thickness of 30 to 150 nm) by a sputtering method, an LPCVD method, a plasma CVD method, or the like.

Laser light irradiation is performed to the amorphous semiconductor film 604 to be crystallized, similarly to Embodiment Mode 2.

The amorphous semiconductor film 604 can be uniformly crystallized by using the above laser irradiation method.

Note that the peeling layer 602, the base insulating film 603, and the amorphous semiconductor film 604 can be formed successively.

Figure 6B:
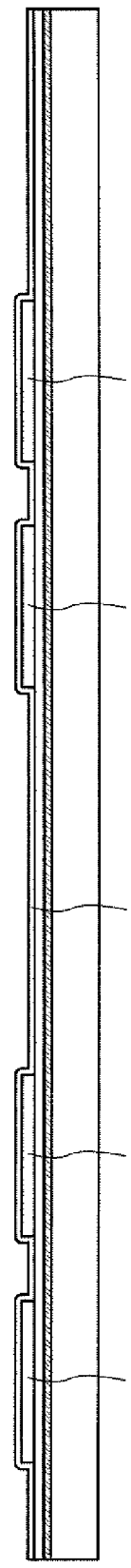

After that, as illustrated in FIG. 6B, a crystalline semiconductor film which is obtained is etched into a desired shape, crystalline semiconductor films 604a to 604d are formed, and a gate insulating film 605 is formed so as to cover the semiconductor films 604a to 604d. The gate insulating film 605 can be formed in a single layer or stacked layers of a film containing silicone nitride, silicon oxide, silicon oxide containing nitrogen, or silicon nitride containing oxygen, by using a plasma CVD method, a sputtering method, or the like.

After the gate insulating film 605 is formed, heat treatment at a temperature of 300 to 450° C. for 1 to 12 hours in an atmosphere containing 3 to 100% of hydrogen may be performed, and a process of hydrogenating the island-shaped crystalline semiconductor films 604a to 604d may be performed. Plasma hydrogenation (using hydrogen excited by plasma) may also be performed as another means of hydrogenation.

The crystalline semiconductor films 604a to 604d obtained by irradiating a semiconductor film with continuous-wave (CW) laser light or pulsed laser light oscillated with a repetition rate of 10 MHz or more and scanning the semiconductor film in one direction for crystallization, have a characteristic that the crystal grows in the scanning direction of the light. When a transistor is placed so that the scanning direction is aligned with the channel length direction (the direction in which carriers flow when a channel formation region is formed) and the above gate insulating layer is used in combination, a thin film transistor (TFT) with fewer characteristic variation and high electron field-effect mobility can be obtained.

Next, a first conductive film and a second conductive film are stacked over the gate insulating film 605. Here, the first conductive film is formed with a thickness of 20 to 100 nm by a plasma CVD method, a sputtering method or the like, and the second conductive film is formed with a thickness of 100 to 400 nm. The first conductive film and the second conductive film are formed using an element of tantalum (Ta), tungsten (W), titanium (Ti), molybdenum (Mo), aluminum (Al), copper (Cu), chromium (Cr), niobium (Nb), or the like, or an alloy material or a compound material containing the above element as its main component. Alternatively, the conductive films are formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the first conductive film and the second conductive film are formed. In addition, in the case of a three-layer structure instead of a two-layer structure, a stacked layer structure of a molybdenum film, an aluminum film, and a molybdenum film may be employed.

Next, a resist mask is formed by a photolithography method, and etching treatment for forming a gate electrode and a gate line is performed, so that gate electrodes 607 are formed above the semiconductor films 604a to 604d.

Next, a resist mask is formed by a photolithography method, and an impurity element imparting n-type conductivity is added at a low concentration into the crystalline semiconductor films 604a to 604d by an ion doping method or an ion implantation method. As the impurity element imparting n-type conductivity, an element which belongs to Group 15, may be used; for example, phosphorus (P) and arsenic (As) are used.

Next, an insulating film is formed so as to cover the gate insulating film 605 and the gate electrodes 607. The insulating film is formed in a single layer or stacked layers of a film containing an inorganic material such as silicon, an oxide of silicon, or a nitride of silicon, or an organic material such as an organic resin, by a plasma CVD method, a sputtering method, or the like. Next, the insulating film is selectively etched by anisotropic etching which mainly etch in a vertical direction, so that insulating films 608 (also referred to as sidewalls) which are in contact with side surfaces of the gate electrodes 607 are formed. The insulating films 608 are used as masks for doping when LDD (Lightly Doped Drain) regions are formed later.

Figure 6C:
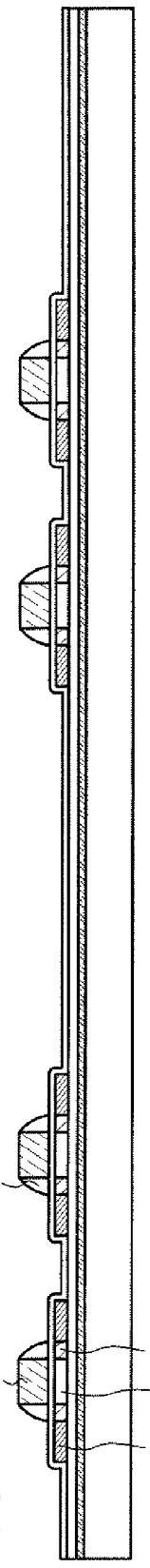

Next, as illustrated in FIG. 6C, using a resist mask formed by a photolithography method, the gate electrodes 607, and the insulating films 608 as masks, an impurity element imparting n-type conductivity is added into the crystalline semiconductor films 604a to 604d, so that first n-type impurity regions 606a (also referred to as LDD regions), second n-type impurity regions 606b, and channel regions 606c are formed. The concentration of the impurity element contained in the first n-type impurity regions 606a is lower than the concentration of the impurity element contained in the second n-type impurity regions 606b.

Figure 6D:
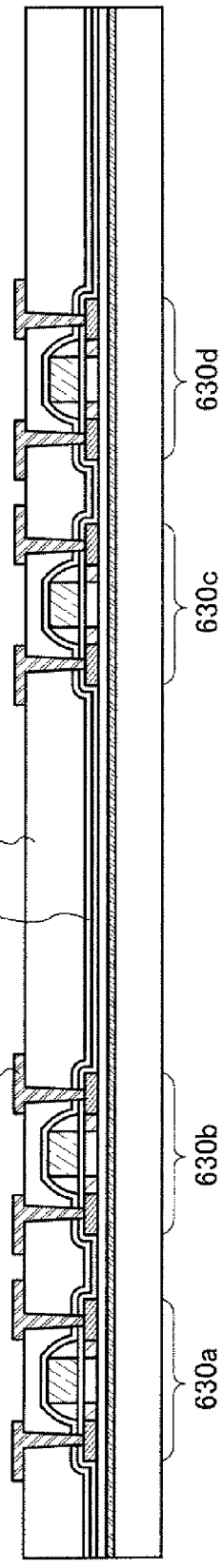

Next, as illustrated in FIG. 6D, an insulating film is formed in a single layer or stacked layers so as to cover the gate electrodes 607, the insulating films 608, and the like; whereby thin film transistors 630a to 630d are formed. The insulating film is formed in a single layer or stacked layers with an inorganic material such as an oxide of silicon or a nitride of silicon, an organic material such as polyimide, polyamide, benzocyclobutene, acrylic, or epoxy, a siloxane material, or the like, by a CVD method, a sputtering method, an SOG method, a droplet discharging method, a screen printing method, or the like. For example, in the case where the insulating film has a two-layer structure, a silicon nitride oxide film may be formed as a first insulating film 609, and a silicon oxynitride film may be formed as a second insulating film 610.

Note that heat treatment for recovering the crystallinity of the semiconductor film, for activating the impurity element which has been added into the semiconductor film, or for hydrogenating the semiconductor film may be performed, before the insulating films 609 and 610 are formed or after one or more of thin films of the insulating films 609 and 610 are formed. For the heat treatment, thermal annealing, a laser annealing method, an RTA method, or the like may be applied.

Next, the insulating films 609 and 610, and the like are etched by a photolithography method, and contact holes are formed to expose the second n-type impurity regions 606b. Then, a conductive film is formed so as to fill the contact holes and the conductive film is selectively etched so as to form conductive films 631. Note that silicide may be formed over the surfaces of the semiconductor films 604a to 604d exposed at the contact holes, before the conductive film is formed.

The conductive films 631 are formed in a single layer or stacked layers with an element of aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the above element as its main component, by a CVD method, a sputtering method, or the like. An alloy material containing aluminum as its main component corresponds to a material which contains aluminum as its main component and also contains nickel or an alloy material which contains aluminum as its main component and which also contains nickel and one or both of carbon and silicon, for example. The conductive films 631 preferably employ, for example, a stacked-layer structure of a barrier film, an aluminum-silicon (Al—Si) film, and a barrier film, or a stacked-layer structure of a barrier film, an aluminum-silicon (Al—Si) film, a titanium nitride film, and a barrier film. Note that a barrier film corresponds to a thin film formed using titanium, a nitride of titanium, molybdenum, or a nitride of molybdenum. Aluminum and aluminum silicon which have low resistance and are inexpensive are optimal materials for forming the conductive films 631. In addition, generation of a hillock of aluminum or aluminum silicon can be prevented when upper and lower barrier layers are formed. Further, when the barrier film is formed using titanium that is a highly-reducible element, even if a thin natural oxide film is formed over the crystalline semiconductor film, the natural oxide film is reduced so that preferable contact with the crystalline semiconductor film can be obtained.

Figure 7A:
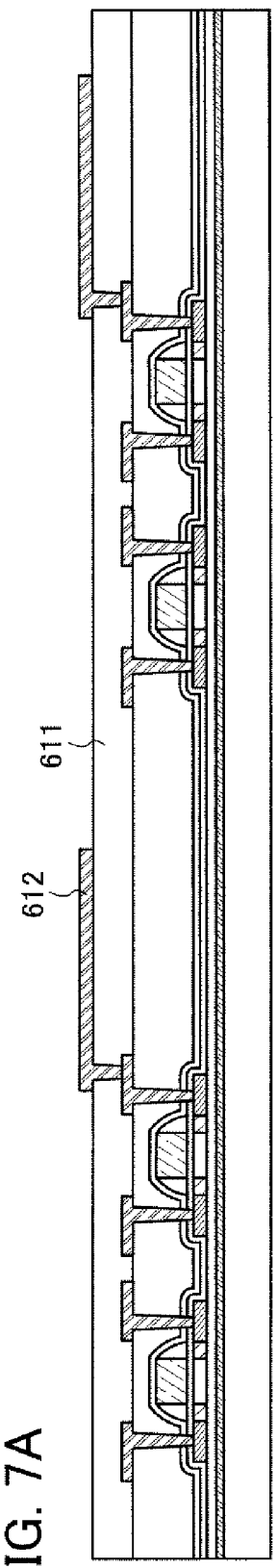
FIGS. 7A to 7C are views illustrating an example of a manufacturing method of a semiconductor device using a laser irradiation apparatus of the present invention.

Next, as illustrated in FIG. 7A, an insulating film 611 is formed so as to cover the conductive films 631, and conductive films 612 are formed over the insulating film 611 so as to be electrically connected to the conductive films 631. The insulating film 611 is formed in a single layer or stacked layers with an inorganic material or an organic material, by a CVD method, a sputtering method, an SOG method, a droplet discharging method, a screen printing method, or the like. The insulating film 611 is preferably formed with a thickness of 0.75 to 3 μm. Further, the conductive films 612 can be formed using any of the materials given in the case of the above conductive films 631.

Figure 7B:
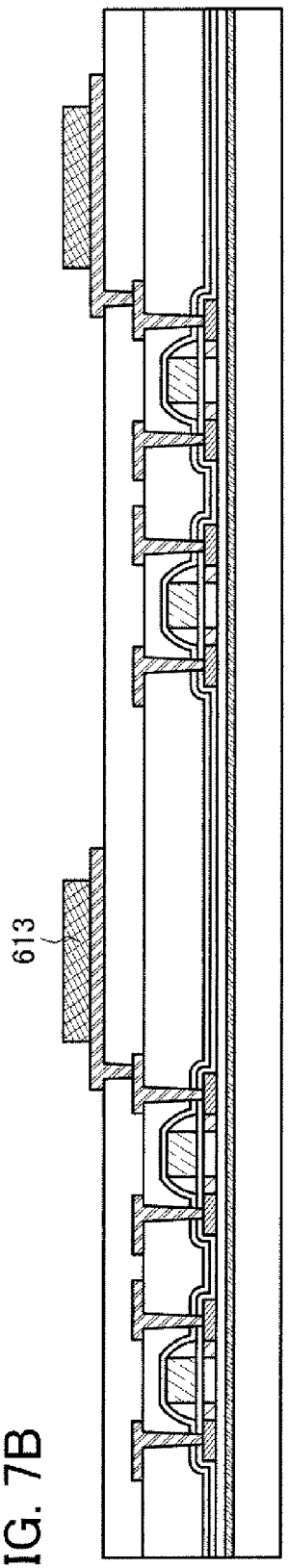

Next, as illustrated in FIG. 7B, conductive films 613 are formed over the conductive films 612. The conductive films 613 are formed using a CVD method, a sputtering method, a droplet discharging method, a screen printing method, or the like with a conductive material. Preferably, the conductive films 613 are formed in a single layer or stacked layers with an element of aluminum (Al), titanium (Ti), silver (Ag), copper (Cu), or gold (Au), or an alloy material or a compound material containing the above element as its main component. Here, a paste containing silver is formed over the conductive films 612 by a screen printing method, and then, heat treatment at a temperature of 50 to 350° C. is performed so as to form the conductive films 613. In addition, after the conductive films 613 are formed over the conductive films 612, regions where the conductive films 613 and the conductive films 612 overlap with each other may be irradiated with laser light so as to improve electrical connection thereof. Note that it is possible to selectively form the conductive films 613 over the conductive films 631 without forming the insulating film 611 and the conductive films 612.

Figure 7C:
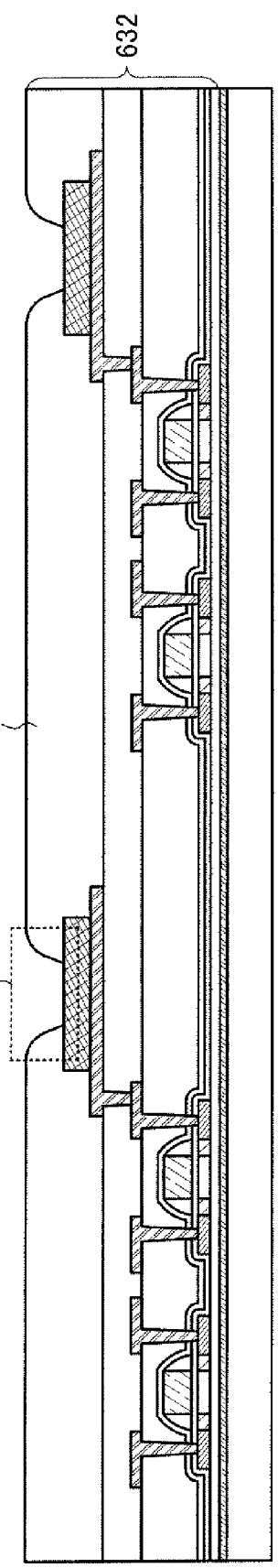

Next, as illustrated in FIG. 7C, an insulating film 614 is formed so as to cover the conductive films 612 and 613, and the insulating film 614 is selectively etched by a photolithography method, so that an openings 615 that expose the conductive films 613 is formed. The insulating film 614 is formed in a single layer or stacked layers with an inorganic material or an organic material, by a CVD method, a sputtering method, an SOG method, a droplet discharge method, a screen printing method, or the like.

Next, a layer 632 including the thin film transistors 630a to 630d and the like (hereinafter described as a layer 632) is peeled from the substrate 601. As illustrated in FIG. 5A, openings 616 are formed by laser light irradiation (such as UV light), and then, the layer 632 can be peeled from the substrate 601 by using physical force. Alternatively, an etchant may be introduced to the openings 616 before peeling the layer 632 from the substrate 601, so that the peeling layer 602 may be removed. As the etchant, a gas or a liquid containing halogen fluoride or an interhalogen compound is used; for example, chlorine trifluoride ($ClF_3$) is used as a gas containing halogen fluoride. Accordingly, the layer 632 is peeled from the substrate 601. The peeling layer 602 may be partially left instead of being removed entirely. Accordingly, consumption of the etchant can be reduced and process time for removing the peeling layer can be shortened. In addition, the layer 632 can be retained over the substrate 601 even after the peeling layer 602 is removed. In addition, the substrate 601 is preferably reused after the layer 632 is peeled off, in order to reduce the cost.

As illustrated in FIG. 8B, after the openings 616 are formed by etching the insulating film by laser light irradiation, a surface of the layer 632 (a surface where the insulating film 614 is exposed) is attached to a first sheet material 617 and the layer 632 can also be peeled completely from the substrate 601. As the first sheet material 617, a thermal peeling tape of which adhesiveness is lowered by heat can be used, for example.

Figure 9A:
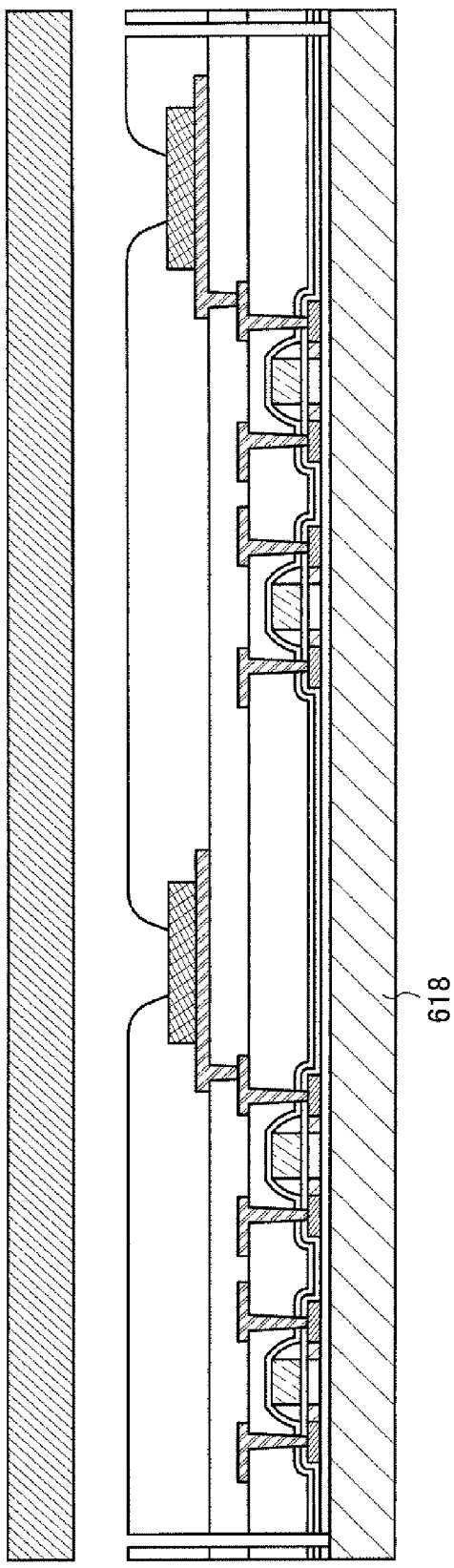
FIGS. 9A and 9B are views illustrating an example of a manufacturing method of a semiconductor device using a laser irradiation apparatus of the present invention.

Next, as illustrated in FIG. 9A, a second sheet material 618 is provided over the other surface (the surface peeled from the substrate 601) of the layer 632, and one or both heat treatment and pressure treatment are performed to attach the second sheet material 618. Concurrently with or after providing the second sheet material 618, the first sheet material 617 is peeled. As the second sheet material 618, a hot-melt film or the like can be used. When a thermal peeling tape is used as the first sheet material 617, the peeling can be performed by utilizing the heat applied in attaching the second sheet material 618.

As the second sheet material 618, a film on which antistatic treatment for preventing static electricity or the like is performed (hereinafter described as an antistatic film) can also be used. As the antistatic film, a film with an antistatic material dispersed in a resin, a film with an antistatic material attached thereon, and the like can be given as examples. The film provided with an antistatic material may be a film with an antistatic material provided over one of its surfaces, or a film with an antistatic material provided over both of its surfaces. Further, as for the film with an antistatic material provided over one of its surfaces, the film may be attached to the layer so that the antistatic material is placed on the inner side of the film or the outer side of the film. The antistatic material may be provided over the entire surface of the film, or over part of the film. As the antistatic material here, a metal, indium tin oxide (ITO), a surfactant such as an amphoteric surfactant, a cationic surfactant, or a nonionic surfactant can be used. In addition to that, as the antistatic material, a resin material containing a cross-linkable copolymer having a carboxyl group and a quaternary ammonium base on its side chain, or the like can be used. By attaching, mixing, or coating a film with such a material to a film, an antistatic film can be formed. By providing the antistatic film, adverse effects on a semiconductor element, when the semiconductor device is dealt with as a commercial product, due to static electricity or the like from outside can be suppressed.

Figure 9B:
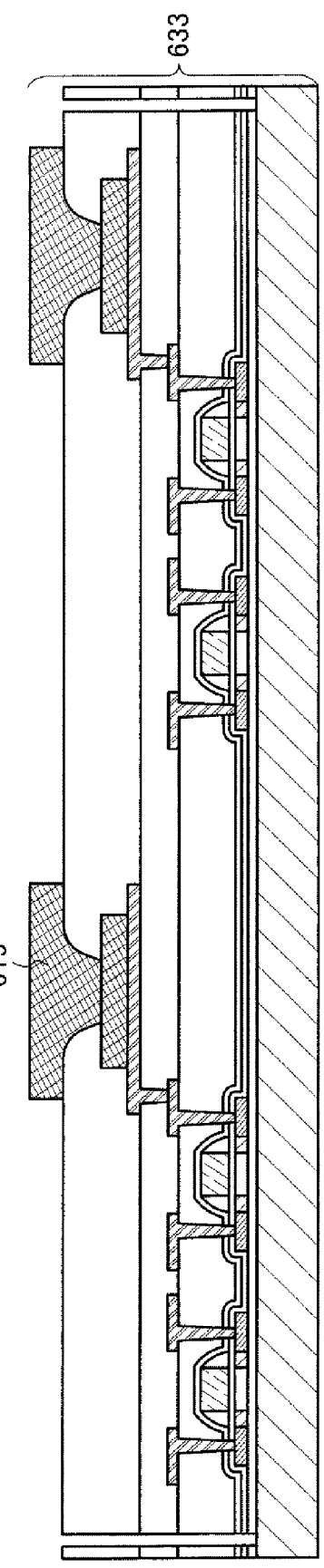

Next, as illustrated in FIG. 9B, conductive films 619 are formed so as to cover the openings 615, so that an element group 633 is formed. Note that the conductive films 612 and 613 may be irradiated with laser light so as to improve electrical connection thereof before or after the formation of the conductive films 619.

Next, as illustrated in FIG. 10A, the element group 633 is selectively irradiated with laser light so as to be divided into a plurality of element groups.

Next, as illustrated in FIG. 10B, the element group 633 is pressure-bonded to a substrate 621 over which a conductive film 622 functioning as an antenna is formed. Specifically, the element group 633 is attached to the substrate 621 so that the conductive film 622 functioning as an antenna formed over the substrate 621 and the conductive film 619 of the element group 633 are electrically connected to each other. Here, the substrate 621 and the element group 633 are bonded to each other by using a resin 623 having adhesiveness. In addition, the conductive film 622 and the conductive film 619 are electrically connected to each other by using a conductive particle 624 contained in the resin 623.

By applying the manufacturing method shown in this embodiment mode, a highly reliable semiconductor device without characteristic variation can be manufactured.

Note that this embodiment mode can be freely combined with the above embodiment modes. That is, the material or the formation method shown in the above embodiment modes can be used in combination also in this embodiment mode, and the material or the formation method shown in this embodiment mode can be used in combination also in the above embodiment modes.

(Embodiment Mode 4)

This embodiment mode will describe an example of usage modes of a semiconductor device which is obtained by the manufacturing method shown in the above Embodiment Mode 3. Specifically, applications of a semiconductor device which can input and output data without contact will be described below with reference to the drawings. The semiconductor device which can input and output data without contact is also referred to as an RFID tag, an ID tag, an IC tag, an IC chip, an RF tag, a wireless tag, an electronic tag, or a wireless chip depending on application modes.

Figure 11A:
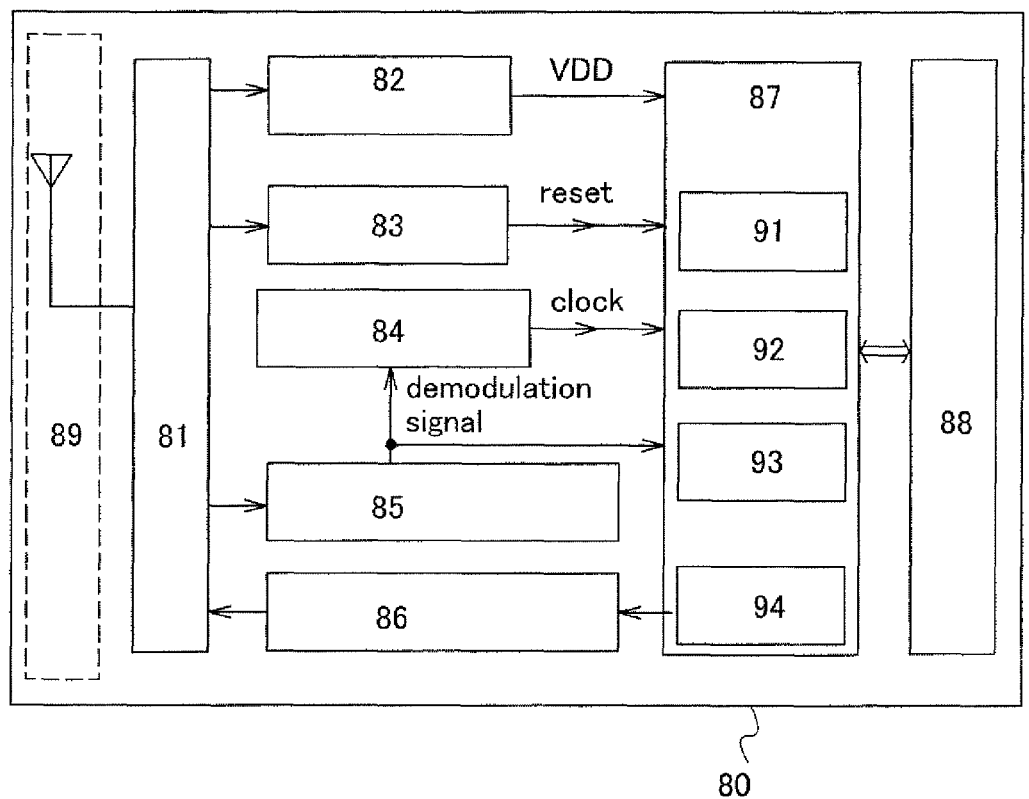
FIGS. 11A to 11C are views each illustrating an example of usage modes of a semiconductor device manufactured using a laser irradiation apparatus of the present invention.

A semiconductor device 80 has a function of communicating data without contact, and includes a high frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG. 11A). The high frequency circuit 81 is a circuit which receives a signal from the antenna 89 and also outputs a signal received from the data modulation circuit 86 from the antenna 89. The power supply circuit 82 is a circuit which generates a power supply potential from the received signal. The reset circuit 83 is a circuit which generates a reset signal. The clock generation circuit 84 is a circuit which generates various clock signals based on the received signal input from the antenna 89. The data demodulation circuit 85 is a circuit which demodulates the received signal and outputs the signal to the control circuit 87. The data modulation circuit 86 is a circuit which modulates a signal received from the control circuit 87. As the control circuit 87, a code extraction circuit 91, a code determination circuit 92, a CRC determination circuit 93, and an output unit circuit 94 are formed, for example. The code extraction circuit 91 is a circuit which separately extracts a plurality of codes included in an instruction transmitted to the control circuit 87. The code determination circuit 92 is a circuit which compares the extracted code and a code corresponding to a reference to determine the content of the instruction. The CRC determination circuit 93 is a circuit which detects the presence or absence of a transmission error or the like based on the determined code.

Next, an example of operation of the above semiconductor device will be described. First, a radio signal is received by the antenna 89. The radio signal is transmitted to the power supply circuit 82 via the high frequency circuit 81, and a high power supply potential (hereinafter described as VDD) is generated. The VDD is supplied to each circuit included in the semiconductor device 80. In addition, a signal transmitted to the data demodulation circuit 85 via the high frequency circuit 81 is demodulated (hereinafter described as a demodulated signal). The demodulated signal is transmitted to the control circuit 87 through the clock generation circuit 84. Further, a signal transmitted through the reset circuit 83 via the high frequency circuit 81 is also transmitted to the control circuit 87. The signal transmitted to the control circuit 87 is analyzed by the code extraction circuit 91, the code determination circuit 92, the CRC determination circuit 93, and the like. Then, in accordance with the analyzed signal, information of the semiconductor device stored in the storage circuit 88 is output. The output information of the semiconductor device is encoded through the output unit circuit 94. Furthermore, the encoded information of the semiconductor device 80 is, through the data modulation circuit 86, transmitted by the antenna 89 as a radio signal. Note that a low power supply potential (hereinafter described as VSS) is common among a plurality of circuits included in the semiconductor device 80, and VSS can be GND.

Thus, data of the semiconductor device can be read by transmitting a signal from a reader/writer to the semiconductor device 80 and receiving the signal transmitted from the semiconductor device 80 by the reader/writer.

In addition, the semiconductor device 80 may supply a power supply voltage to each circuit by an electromagnetic wave without a power source (a battery) mounted, or by an electromagnetic wave and a power source (a battery) with the power source (a battery) mounted.

A semiconductor device which can be bent can be manufactured by using the manufacturing method shown in Embodiment Mode 3. Therefore, the semiconductor device can be attached to an object having a curved surface. In addition, by applying the manufacturing method shown in Embodiment Mode 3, a highly reliable semiconductor device without characteristic variation can be manufactured.

Figure 11B:
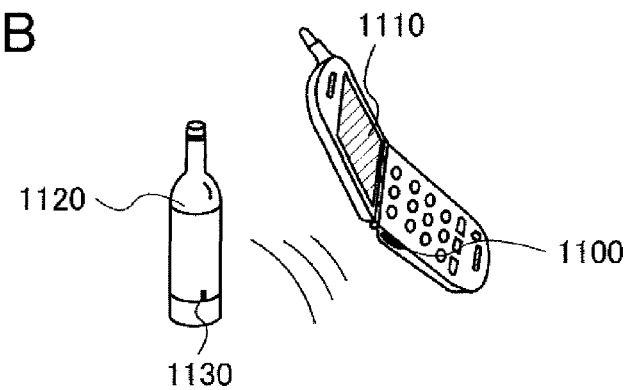
Figure 11C:
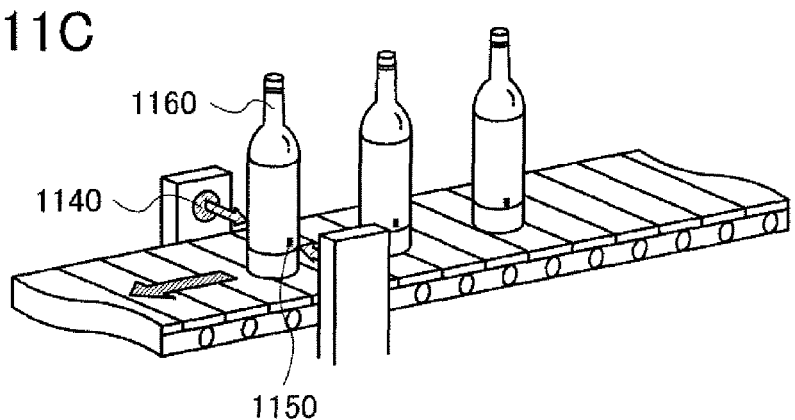

Next, an example of usage modes of a flexible semiconductor device which can input and output data without contact will be described. As illustrated in FIG. 11B, a side face of a portable terminal including a display portion 1110 is provided with a reader/writer 1100. A side face of an article 1120 is provided with a semiconductor device 1130. When the reader/writer 1100 is held over the semiconductor device 1130, information on the article 1120 such as a raw material, the place of origin, an inspection result in each production step, the history of distribution, or an explanation of the article is displayed on the display portion 1110. Further, as illustrated in FIG. 11C, when a product 1160 is transported by a conveyor belt, the product 1160 can be inspected using a reader/writer 1140 and a semiconductor device 1150 attached to the product 1160.

Thus, by utilizing the semiconductor device in a system, information can be acquired easily, and improvement in functionality and added value of the system can be achieved. By applying the manufacturing method shown in Embodiment Mode 3, a transistor or the like included in a semiconductor device can be prevented from being damaged even when the semiconductor device fabricated by applying the present invention is attached to an object having a curved surface; thus, a highly reliable semiconductor device can be provided.

In addition, as a signal transmission method in the above semiconductor device which can input and output data without contact, an electromagnetic coupling method, an electromagnetic induction method, a microwave method, or the like can be used. The transmission method may be selected as appropriate by a practitioner in consideration of an intended use, and an optimum antenna may be provided in accordance with the transmission method.

In the case where, for example, an electromagnetic coupling method or an electromagnetic induction method (for example, 13.56 MHz band) is applied as the signal transmission method in the semiconductor device, electromagnetic induction caused by a change in magnetic field density is used. Therefore, the conductive film functioning as an antenna is formed in an annular shape (for example, a loop antenna) or a spiral shape (for example, a spiral antenna).

In the case where a microwave method (for example, UHF band (860 to 960 MHz band), a 2.45 GHz band, or the like) is applied as the signal transmission method in the semiconductor device, the shape such as a length of the conductive film functioning as an antenna may be set as appropriate in consideration of a wavelength of an electromagnetic wave used for signal transmission.

FIGS. 12A to 12D illustrate semiconductor devices having antennas with various shapes. These semiconductor devices each have a substrate 1201, an antenna 1202, and an IC chip 1203.

Figure 12A:
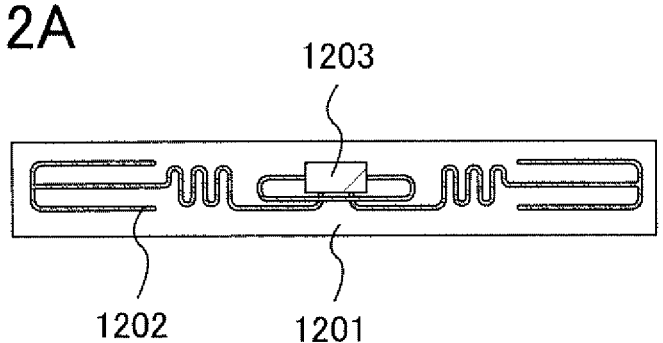
FIGS. 12A to 12D are views each illustrating an example of usage modes of a semiconductor device manufactured using a laser irradiation apparatus of the present invention.
Figure 12B:
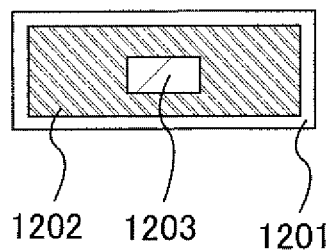
Figure 12C:
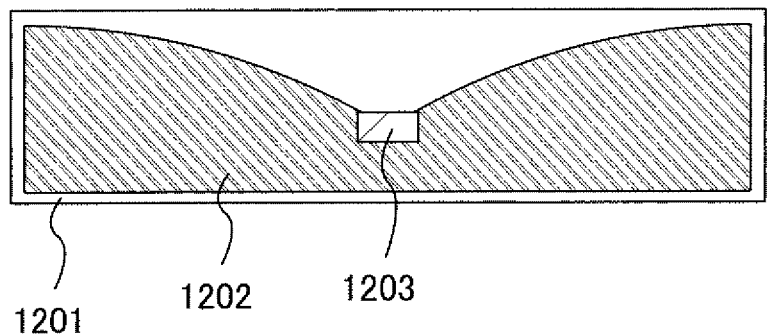
Figure 12D:
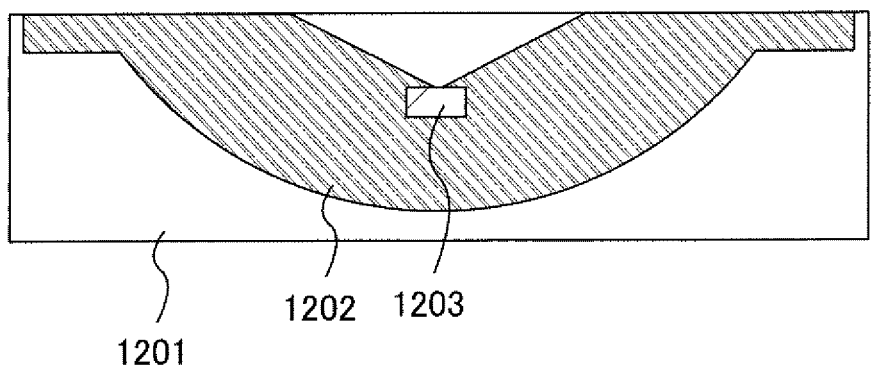

When the conductive film functioning as an antenna is formed in a linear shape, for example, a dipole antenna as illustrated in FIG. 12A is obtained. When the conductive film functioning as an antenna is formed in a flat shape, for example, a patch antenna as illustrated in FIG. 12B is obtained. Alternatively, the conductive film functioning as an antenna can be formed in a ribbon-like shape and the like as illustrated in FIGS. 12C and 12D. The shape of the conductive film functioning as an antenna is not limited to a linear shape, and it may be formed in a curved-line shape, a meander shape, or a combination thereof, in consideration of a wavelength of an electromagnetic wave. In whichever shape the conductive film functioning as an antenna is formed, damage to the element group or the like can be prevented by controlling the pressure applied to the element group when the element group is attached to the substrate while monitoring the pressure applied to the element group so that excessive pressure is prevented from being applied.

The conductive film functioning as an antenna is formed with a conductive material by using a CVD method, a sputtering method, a printing method such as screen printing or gravure printing, a droplet discharging method, a dispenser method, a plating method, or the like. The conductive film is formed in a single-layer or stacked-layer structure using an element of aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing the element as its main component.

In the case where a conductive film functioning as an antenna is formed by, for example, a screen printing method, the conductive film can be formed by selectively printing a conductive paste in which conductive particles each having a grain size of several nm to several tens of μm are dissolved or dispersed in an organic resin. As the conductive particle, a fine particle or a dispersive nanoparticle of one or more metals of silver (Ag), gold (Au), copper (Cu), nickel (Ni), platinum (Pt), palladium (Pd), tantalum (Ta), molybdenum (Mo), or titanium (Ti); or silver halide can be used. In addition, as the organic resin contained in the conductive paste, one or a plurality of organic resins each functioning as a binder, a solvent, a dispersant, or a coating of the metal particle can be used. Typically, an organic resin such as an epoxy resin or a silicone resin can be used. When forming a conductive film, baking is preferably performed after the conductive paste is applied. For example, in the case where fine particles (of which grain size of 1 nm or more and 100 nm or less inclusive) containing silver as its main component is used as a material of the conductive paste, a conductive film can be obtained by hardening the paste by baking at a temperature of 150 to 300° C. Alternatively, fine particles containing solder or lead-free solder as its main component may be used. In this case, a fine particle having a grain size of 20 μm or less is preferably used. Solder or lead-free solder has an advantage such as low cost.

Besides the above materials, ceramic, ferrite, or the like may be applied to an antenna. Furthermore, a material of which dielectric constant and magnetic permeability are negative in a microwave band (metamaterial) can also be applied to an antenna.

In the case where an electromagnetic coupling method or an electromagnetic induction method is applied and a semiconductor device including an antenna is placed in contact with a metal, a magnetic material having magnetic permeability is preferably provided between the semiconductor device and the metal. In the case where a semiconductor device including an antenna is provided in contact with a metal, an eddy current flows in the metal accompanying a change in a magnetic field, and a demagnetizing field generated by the eddy current impairs a change in a magnetic field and decreases a communication range. Therefore, an eddy current of the metal and a decrease in the communication range can be suppressed by providing a material having magnetic permeability between the semiconductor device and the metal. Note that ferrite or a metal thin film having high magnetic permeability and little loss of high frequency wave can be used as the magnetic material.

Note that an applicable range of the flexible semiconductor device is wide in addition to the above, and the flexible semiconductor device is applicable to any product as long as it is a product whose production, management, or the like can be supported by clarifying information such as the history of an object without contact. For example, the semiconductor device can be mounted on paper money, coins, securities, certificates, bearer bonds, packing containers, books, recording media, personal belongings, vehicles, food, clothing, health products, commodities, medicines, electronic devices, or the like. Examples of them will be described with reference to FIGS. 13A to 13H.

Figure 13A:
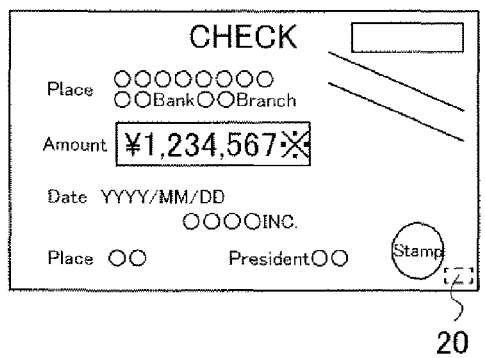
FIGS. 13A to 13H are views each illustrating an example of usage modes of a semiconductor device manufactured using a laser irradiation apparatus of the present invention.
Figure 13B:
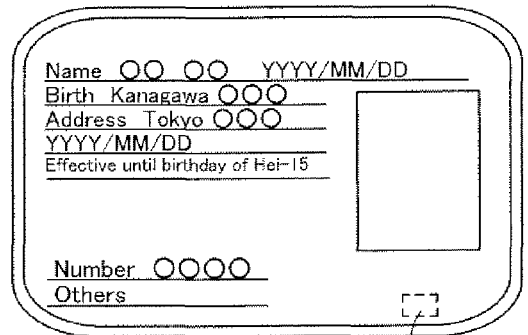
Figure 13C:
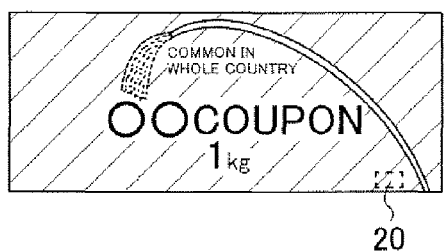
Figure 13D:
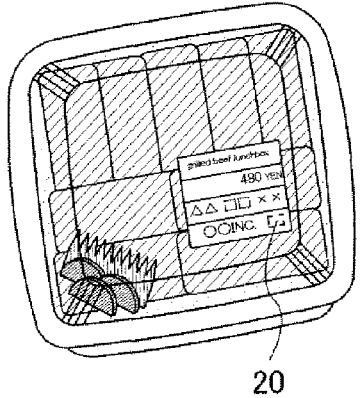
Figure 13E:
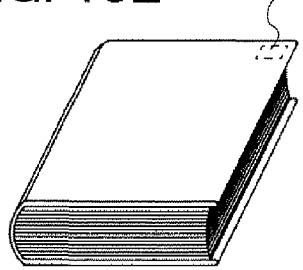
Figure 13F:
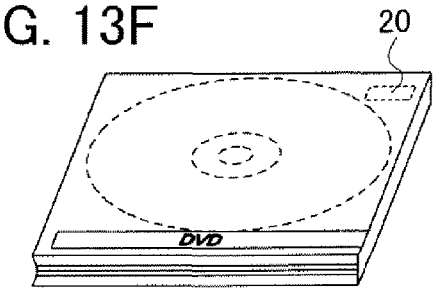
Figure 13G:
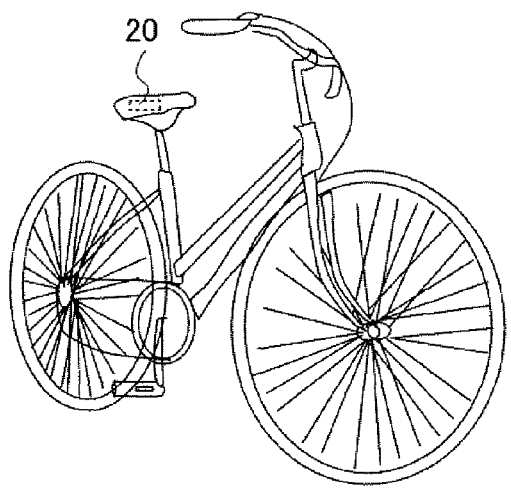
Figure 13H:
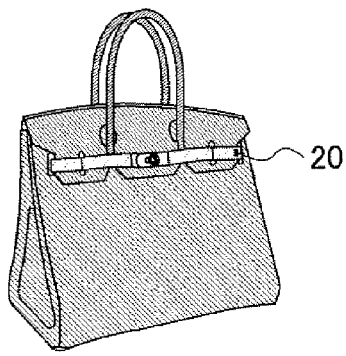

The paper money and coins are money distributed to the market, and include one valid in a certain area (cash voucher), memorial coins, and the like. FIG. 13A illustrates the securities, which refer to checks, certificates, promissory notes, and the like. FIG. 13B illustrates the certificates, which refer to driver's licenses, certificates of residence, and the like. FIG. 13C illustrates the bearer bonds, which refer to stamps, rice coupons, various gift certificates, and the like. FIG. 13D illustrates the packing containers, which refer to wrapping paper for lunchboxes and the like, plastic bottles, and the like. FIG. 13E illustrates the books, which refer to hardbacks, paperbacks, and the like. FIG. 13F illustrates the recording media, which refer to DVD software, video tapes, and the like. FIG. 13G illustrates the vehicles, which refer to wheeled vehicles such as bicycles, ships, and the like. FIG. 13H illustrates the personal belongings, which refer to bags, glasses, and the like. The food refers to food articles, drink, and the like. The clothing refers to clothes, footwear, and the like. The health products refer to medical instruments, health instruments, and the like. The commodities refer to furniture, lighting equipment, and the like. The medicines refer to medical products, agricultural chemicals, and the like. The electronic devices refer to liquid crystal display devices, EL display devices, television devices (television receivers, flat-screen TV sets), cellular phones, and the like.

Forgery can be prevented by providing the semiconductor device 20 illustrated in FIGS. 13A to 13H to the paper money, the coins, the securities, the certificates, the bearer bonds or the like. Efficiency of an inspection system, a system used in a rental shop, or the like can be improved by providing the semiconductor device 20 to the packing containers, the books, the recording media, the personal belongings, the food, the commodities, the electronic devices, or the like. Forgery or theft can be prevented by providing the semiconductor device 20 to the vehicles, the health products, the medicine, or the like; further, in the case of the medicine, medicine can be prevented from being taken mistakenly. The semiconductor device 20 can be provided to the foregoing article by being attached to the surface or being embedded therein. For example, in the case of a book, the semiconductor device 20 may be embedded in a piece of paper; in the case of a package made from an organic resin, the semiconductor device 20 may be embedded in the organic resin.

As described above, efficiency of an inspection system, a system used in a rental shop, or the like can be improved by providing the semiconductor device to the packing containers, the recording media, the personal belonging, the food, the clothing, the commodities, the electronic devices, or the like. In addition, by providing the semiconductor device to the vehicles, forgery or theft can be prevented. Further, by implanting the semiconductor device in a creature such as an animal, an individual creature can be easily identified. For example, by implanting the semiconductor device with a sensor in a creature such as livestock, its health condition such as a current body temperature as well as its birth year, sex, breed, or the like can be easily managed.

Note that this embodiment mode can be freely combined with the above embodiment modes. That is, the material or the formation method shown in the above embodiment modes can be used in combination also in this embodiment mode, and the material or the formation method shown in this embodiment mode can be used in combination also in the above embodiment modes.

(Embodiment Mode 5)

Various electronic devices can be manufactured by incorporating a TFT obtained by implementing the present invention. Specific examples are illustrated in FIGS. 14A to 14F.

Figure 14A:
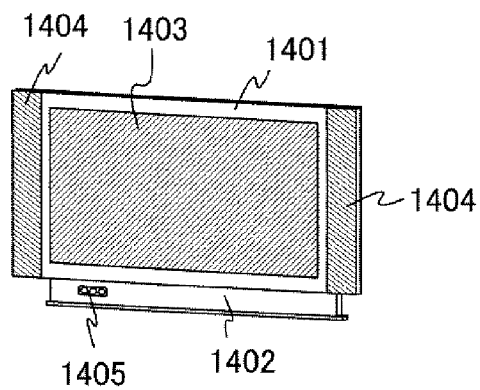
FIGS. 14A to 14F are views each illustrating an electronic device manufactured using a laser irradiation apparatus of the present invention.

FIG. 14A illustrates a display device including a housing 1401, a supporter 1402, a display portion 1403, a speaker portion 1404, a video input terminal 1405, and the like. A TFT formed by applying the present invention can be used for a driver IC, the display portion 1403, and the like. The display device includes a liquid crystal display device, a light-emitting display device, and the like, and further includes all the information displaying devices for computers, television reception, advertisement display, and the like. Specifically, a display, a head mount display, a reflection type projector, and the like are given.

Figure 14B:
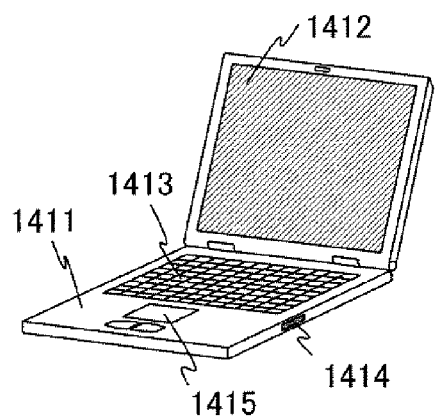

FIG. 14B illustrates a computer including a housing 1411, a display portion 1412, a keyboard 1413, an external connection port 1414, a pointing device 1415, and the like. A TFT formed by applying the present invention is applicable not only to a pixel portion of the display portion 1412 but also to a semiconductor device such as a driver IC for display, a CPU inside a main body, or a memory.

Figure 14C:
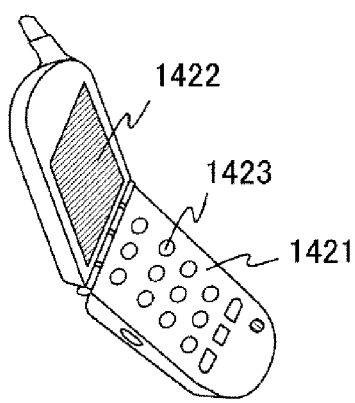

FIG. 14C illustrates a cellular phone, as a typical example of mobile information processing terminals. This cellular phone includes a housing 1421, a display portion 1422, an operation key 1423, and the like. A TFT formed by applying the present invention is applicable not only to a pixel portion of the display portion 1422 but also to a driver IC for display, a memory, an audio processing circuit, or the like.

In addition to the above cellular phone, a TFT formed by applying the present invention can be used for an electronic device such as a PDA (Personal Digital Assistant, information mobile terminal), a digital camera, or a compact game machine. For example, it is possible to apply the TFT of the present invention to a functional circuit such as a CPU, a memory, or a sensor, or to a pixel portion of such an electronic device or a driver IC for display.

Figure 14D:
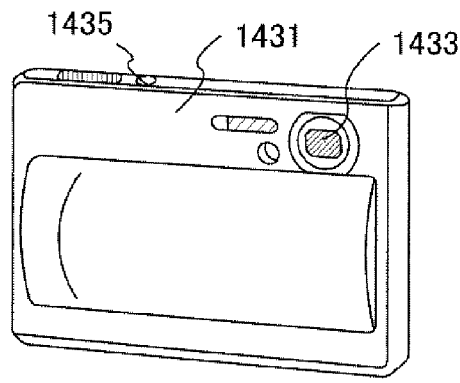
Figure 14E:
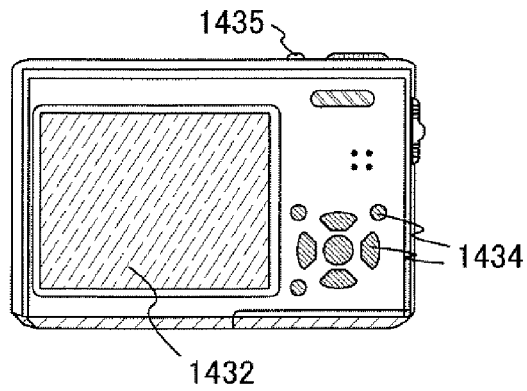

FIGS. 14D and 14E illustrate a digital camera. FIG. 14E illustrates a rear side of the digital camera illustrated in FIG. 14D. This digital camera includes a housing 1431, a display portion 1432, a lens 1433, an operation key 1434, a shutter button 1435, and the like. A TFT formed by applying the present invention is applicable to a pixel portion of the display portion 1432, a driver IC for driving the display portion 1432, a memory, or the like.

Figure 14F:
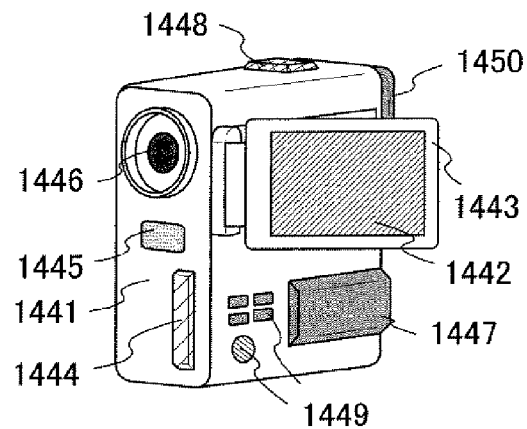
Figure 15A:
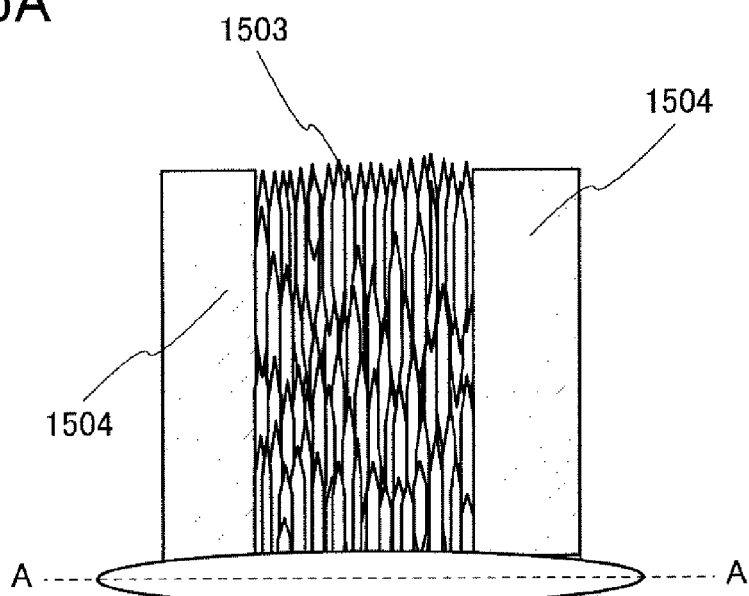
FIGS. 15A and 15B are views illustrating a laser shape, a laser irradiation track, and energy intensity distribution.
Figure 15B:
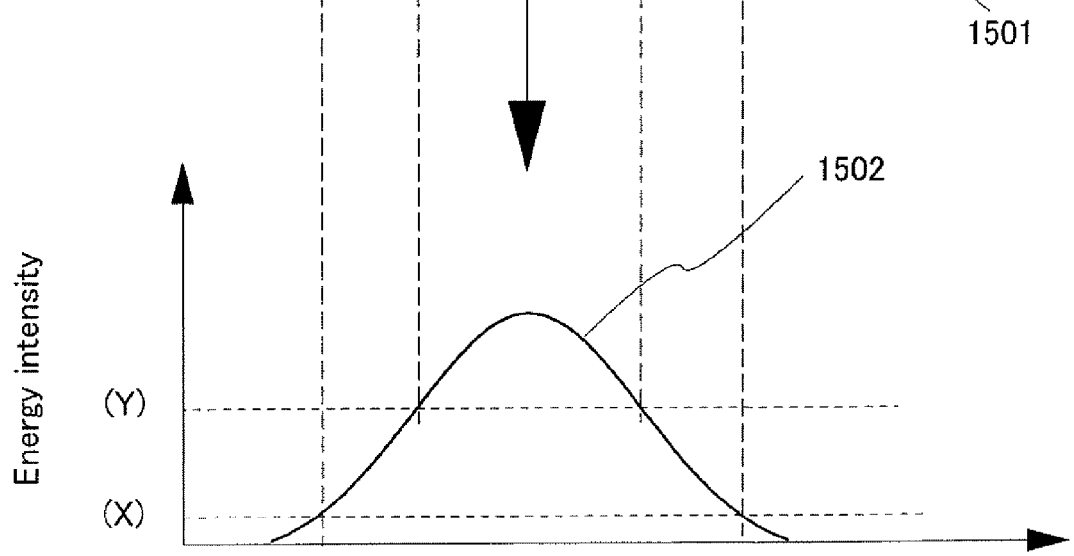

FIG. 14F illustrates a digital video camera including a main body 1441, a display portion 1442, a housing 1443, an external connection port 1444, a remote control receiving portion 1445, an image receiving portion 1446, a battery 1447, an audio input portion 1448, an operation key 1449, an eyepiece portion 1450, and the like. A TFT formed by applying the present invention is applicable to a pixel portion of the display portion 1442, a driver IC for controlling the display portion 1442, a memory, a digital input processing device, a sensor portion, or the like.

Besides, a TFT formed by applying the present invention can be used for a navigation system, an audio reproducing device, an image reproducing device equipped with a recording medium, or the like. TFTs formed by applying the present invention can be used for pixel portions of display portions of these devices, driver ICs for controlling the display portions, memories, digital input processing devices, sensor portions, or the like.

As thus described, the application range of a TFT manufactured by applying the present invention is extremely wide, and the TFT manufactured by applying the present invention can be used for electronic devices of every field. Note that the display devices used in the electronic devices can employ not only glass substrates but also heat-resistant substrates formed with a synthetic resin, in accordance with the size, strength, and intended purpose. Accordingly, further reduction in weight can be achieved.

The present application is based on Japanese Patent Application serial no. 2006-271363 filed in Japan Patent Office on Oct. 3, 2006, the entire contents of which are hereby incorporated by reference.

What is claimed is:

1. A laser irradiation apparatus comprising:
   a laser oscillator configured to emit a laser light;
   an optical element configured to converge the laser light in one direction; and
   means for shielding an end region in a major-axis direction of the laser light, which is disposed between the optical element and an irradiation surface and is configured to make energy intensity in the irradiation surface higher in an end region in the major-axis direction of the laser light than a central region in the major-axis direction of the laser light,
   wherein the means for shielding comprises a slit plate, and
   wherein a surface of the slit plate facing the irradiation surface is tapered.

2. The laser irradiation apparatus according to claim 1, wherein the laser oscillator is configured to emit a continuous-wave laser or a pulsed laser with a repetition rate of 10 MHz or more.

3. The laser irradiation apparatus according to claim 1, wherein the optical element is a cylindrical lens or a diffractive optical element.

4. A laser irradiation apparatus comprising:
   a laser oscillator configured to emit a laser light;
   an optical element configured to converge the laser light in one direction; and
   means for shielding an end region in a major-axis direction of the laser light, which is disposed between the optical element and an irradiation surface,
   wherein the means for shielding is disposed at a position which satisfies $0.5 < L\lambda < 100$ or $1 < L < 200$, where a distance between the means for shielding and the irradiation surface is $L$ µm and a wavelength of the laser light is $\lambda$ µm,
   wherein energy intensity in the irradiation surface is higher in an end region in the major-axis direction of the laser light than a central region in the major-axis direction of the laser light.

5. The laser irradiation apparatus according to claim 4, wherein the laser oscillator is configured to emit a continuous-wave laser or a pulsed laser with a repetition rate of 10 MHz or more.

6. The laser irradiation apparatus according to claim 4, wherein the optical element is a cylindrical lens or a diffractive optical element.

7. The laser irradiation apparatus according to claim 4, wherein the means for shielding is a reflecting mirror.

8. A laser irradiation apparatus comprising:
   a laser oscillator configured to emit a laser light;
   a diffractive optical element configured to converge the laser light in one direction; and
   a reflecting mirror for shielding an end region in a major-axis direction of the laser light, which is disposed between the diffractive optical element and an irradiation surface and is configured to make energy intensity in the irradiation surface higher in an end region in the major-axis direction of the laser light than a central region in the major-axis direction of the laser light,
   wherein the reflecting mirror is disposed by inclining a reflective surface to the irradiation surface.

9. The laser irradiation apparatus according to claim 8, wherein the laser oscillator is configured to emit a continuous-wave laser or a pulsed laser with a repetition rate of 10 MHz or more.

10. A laser irradiation method comprising steps of:
    passing a laser light emitted from a laser oscillator through an optical element;
    shielding an end region in a major-axis direction of the laser light passed through the optical element by means for shielding comprising a slit plate, thereby obtaining a laser light in which energy intensity of an end region in the major-axis direction is higher than a central region; and
    irradiating an irradiation surface with the laser light in which energy intensity of the end region in the major-axis direction is higher than the central region; and
    wherein a surface of the slit plate facing the irradiation surface is tapered.

11. The laser irradiation method according to claim 10, wherein the laser oscillator is configured to emit a continuous-wave laser or a pulsed laser with a repetition rate of 10 MHz or more.

12. The laser irradiation method according to claim 10, wherein the optical element is a cylindrical lens or a diffractive optical element.

13. A laser irradiation method comprising steps of:
    passing a laser light emitted from a laser oscillator through an optical element;
    shielding an end region in a major-axis direction of the laser light passed through the optical element by means for shielding disposed at a position which satisfies $0.5 < L\lambda < 100$ or $1 < L < 200$, where a distance between the means for shielding and an irradiation surface is $L$ µm and a wavelength of the laser light is $\lambda$ µm; and
    irradiating the irradiation surface with the laser light in which energy intensity of an end region in the major-axis direction is higher than a central region, after shielding the end region in the major-axis direction of the laser light.

14. The laser irradiation method according to claim 13, wherein the laser oscillator is configured to emit a continuous-wave laser or a pulsed laser with a repetition rate of 10 MHz or more.

15. The laser irradiation method according to claim 13, wherein the optical element is a cylindrical lens or a diffractive optical element.

16. The laser irradiation method according to claim 13, wherein the means for shielding is a reflecting mirror.

17. A laser irradiation method comprising steps of:
    passing a laser light emitted from a laser oscillator through a diffractive optical element;
    shielding an end region in a major-axis direction of the laser light passed through the diffractive optical element by a reflecting mirror, thereby obtaining a laser light in which energy intensity of an end region in the major-axis direction is higher than a central region; and irradiating an irradiation surface with the laser light in which energy intensity of the end region in the major-axis direction is higher than the central region, wherein the reflecting mirror is disposed by inclining a reflective surface to the irradiation surface.

18. The laser irradiation method according to claim 17, wherein the laser oscillator is configured to emit a continuous-wave laser or a pulsed laser with a repetition rate of 10 MHz or more.

19. The laser irradiation apparatus according to claim 7, wherein the reflecting mirror is disposed by inclining a reflective surface to the irradiation surface.

20. The laser irradiation method according to claim 16, wherein the reflecting mirror is disposed by inclining a reflective surface to the irradiation surface.

21. The laser irradiation apparatus according to claim 8, further comprising a damper, wherein a laser light reflected by the reflecting mirror is configured to be absorbed by the damper.

22. The laser irradiation method according to claim 17, further comprising a step of absorbing a laser light reflected by the reflecting mirror by a damper.

* * * * *